(12) United States Patent
Yang et al.

(10) Patent No.: US 11,545,463 B2
(45) Date of Patent: Jan. 3, 2023

(54) CHIP PACKAGE STRUCTURE WITH RING-LIKE STRUCTURE

(71) Applicant: Taiwan Semiconductor Manufacturing Company, Ltd., Hsinchu (TW)

(72) Inventors: Sheng-Yao Yang, Hsinchu (TW); Ling-Wei Li, Hsinchu (TW); Yu-Jui Wu, Hsinchu (TW); Cheng-Lin Huang, Hsinchu (TW); Chien-Chen Li, Hsinchu (TW); Lieh-Chuan Chen, Hsinchu (TW); Che-Jung Chu, Hsinchu (TW); Kuo-Chio Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/394,621

(22) Filed: Aug. 5, 2021

(65) Prior Publication Data

US 2021/0375821 A1 Dec. 2, 2021

Related U.S. Application Data

(62) Division of application No. 16/454,350, filed on Jun. 27, 2019, now Pat. No. 11,088,108.

(51) Int. Cl.
*H01L 23/00* (2006.01)
*H01L 21/768* (2006.01)

(52) U.S. Cl.
CPC ........ *H01L 24/81* (2013.01); *H01L 21/76816* (2013.01); *H01L 21/76871* (2013.01); *H01L 24/09* (2013.01); *H01L 24/11* (2013.01); *H01L 24/17* (2013.01); *H01L 24/30* (2013.01)

(58) Field of Classification Search
CPC .............. H01L 24/81; H01L 21/76816; H01L 21/76871; H01L 24/09; H01L 24/11; H01L 24/30; H01L 24/17
USPC ....................................................... 257/737
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Didarul A Mazumder
(74) *Attorney, Agent, or Firm* — McClure, Qualey & Rodack, LLP

(57) ABSTRACT

A method for forming a chip package structure is provided. The method includes forming a first conductive bump and a first ring-like structure over a chip. The first ring-like structure surrounds the first conductive bump, the first ring-like structure and the first conductive bump are made of a same first material, the chip includes an interconnect structure, and the first ring-like structure is electrically insulated from the interconnect structure and the first conductive bump. The method includes bonding the chip to a substrate through the first conductive bump.

20 Claims, 22 Drawing Sheets

(56) References Cited

U.S. PATENT DOCUMENTS

| | | | |
|---|---|---|---|
| 2015/0364386 A1* | 12/2015 | Yu | H01L 25/0657 |
| | | | 438/15 |
| 2017/0081178 A1* | 3/2017 | Speight | B81C 1/00238 |
| 2019/0051622 A1* | 2/2019 | Chen | H01L 24/02 |

* cited by examiner

CHIP PACKAGE STRUCTURE WITH RING-LIKE STRUCTURE

CROSS REFERENCE

This application is a Divisional of U.S. application Ser. No. 16/454,350, filed on Jun. 27, 2019, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the chip package structure of FIG. 1A, in accordance with some embodiments.

FIG. 1B-1 is a top view of the chip package structure of FIG. 1B, in accordance with some embodiments.

FIG. 1C-1 is a top view of the chip package structure of FIG. 1C, in accordance with some embodiments.

FIG. 1D-1 is a top view of the chip package structure of FIG. 1D, in accordance with some embodiments.

FIG. 1E-1 is a top view of the chip package structure of FIG. 1E, in accordance with some embodiments.

FIG. 1G-1 is a top view of the chip package structure of FIG. 1G, in accordance with some embodiments.

FIG. 1H-1 is a top view of the chip package structure of FIG. 1H, in accordance with some embodiments.

FIG. 1I-1 is a top view of the chip package structure of FIG. 1I, in accordance with some embodiments.

DETAILED DESCRIPTION

Figure 1A:
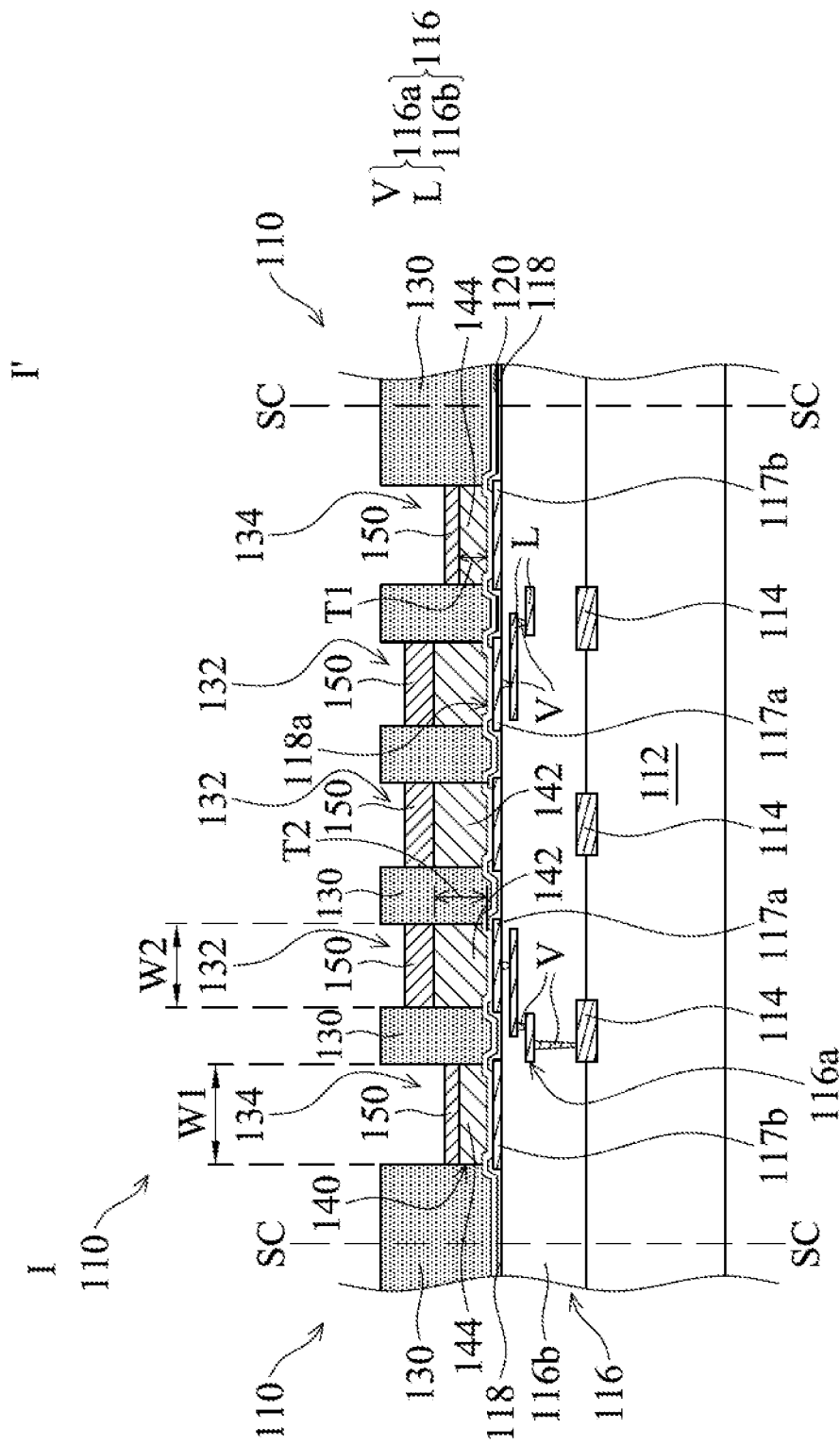
FIGS. 1A, 1B, 1C, 1D, 1E, 1F, 1G, 1H, and 1I are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are cross-sectional views of various stages of a process for forming a chip package structure, in accordance with some embodiments. As shown in FIG. 1A, a substrate 112 is provided, in accordance with some embodiments. In some embodiments, the substrate 112 is made of an elementary semiconductor material including silicon or germanium in a single crystal, polycrystal, or amorphous structure.

In some other embodiments, the substrate 112 is made of a compound semiconductor, such as silicon carbide, gallium arsenide, gallium phosphide, indium phosphide, indium arsenide, an alloy semiconductor, such as SiGe, or GaAsP, or a combination thereof. The substrate 112 is also referred to as a semiconductor substrate, in accordance with some embodiments. The substrate 112 may also include multi-layer semiconductors, semiconductor on insulator (SOI) (such as silicon on insulator or germanium on insulator), or a combination thereof.

As shown in FIG. 1A, devices 114 are formed in and/or over the substrate 112, in accordance with some embodiments. The devices 114 include electronic elements, in accordance with some embodiments. The electronic elements include active elements (e.g. transistors, diodes, or the like) and/or passive elements (e.g. resistors, capacitors, inductors, or the like), in accordance with some embodiments.

As shown in FIG. 1A, an interconnect layer 116 is formed over the substrate 112 and covers the devices 114, in accordance with some embodiments. As shown in FIG. 1A, conductive pads 117a and 117b are formed over the interconnect layer 116, in accordance with some embodiments. The interconnect layer 116 includes an interconnect structure 116a and a dielectric layer 116b, in accordance with some embodiments. The interconnect structure 116a is in the dielectric layer 116b, in accordance with some embodiments.

The interconnect structure 116a includes wiring layers L and conductive vias V, in accordance with some embodiments. The conductive vias V are electrically connected between different wiring layers L, in accordance with some embodiments. The conductive vias V are electrically connected between the wiring layer L and the conductive pads 117a, in accordance with some embodiments.

The conductive vias V are electrically connected between the wiring layer L and the devices 114, in accordance with some embodiments. The interconnect structure 116a is electrically insulated from the conductive pads 117b, in accordance with some embodiments. The wiring layers L, the conductive vias V, and the conductive pads 117a and 117b are made of a conductive material, such as metal (e.g., aluminum, copper, silver, gold, nickel, tungsten, or alloys thereof), in accordance with some embodiments.

As shown in FIG. 1A, a passivation layer 118 is formed over the interconnect layer 116 to cover edge portions of the conductive pads 117a and 117b, in accordance with some embodiments. The passivation layer 118 has openings 118a partially exposing the conductive pads 117a and 117b, in accordance with some embodiments. The passivation layer 118 is made of polyimide, silicon oxide, silicon nitride, un-doped silicate glass (USG), or another suitable dielectric material, in accordance with some embodiments.

As shown in FIG. 1A, a seed layer 120 is formed over the passivation layer 118 and the conductive pads 117a and 117b, in accordance with some embodiments. The materials of the seed layer 120 include titanium, copper, or the like, in accordance with some embodiments. The seed layer 120 is formed using a physical vapor deposition (PVD) process such as a sputtering process, in accordance with some embodiments.

Figures 1, 1A:
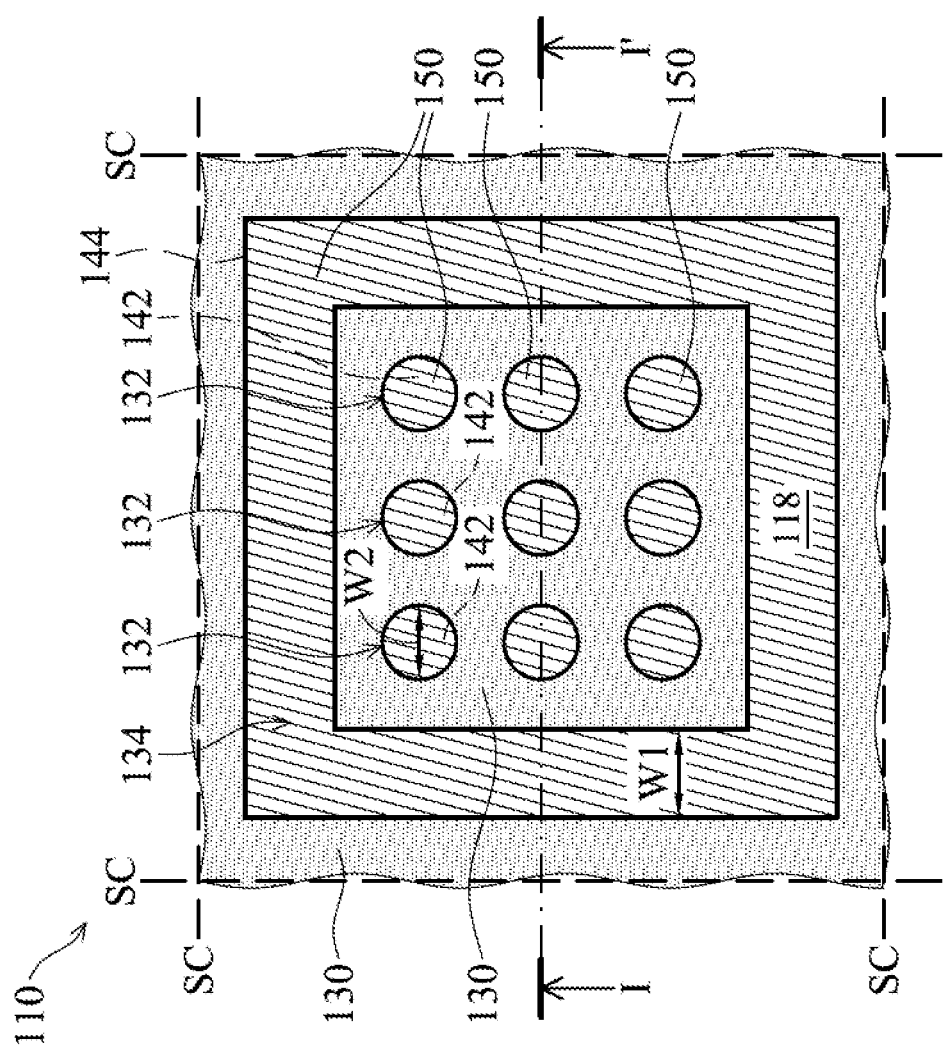

FIG. 1A-1 is a top view of the chip package structure of FIG. 1A, in accordance with some embodiments. FIG. 1A is a cross-sectional view illustrating the chip package structure along a sectional line I-I' in FIG. 1A-1, in accordance with some embodiments.

As shown in FIGS. 1A and 1A-1, a mask layer 130 is formed over the seed layer 120, in accordance with some embodiments. The mask layer 130 has openings 132 and a trench 134, in accordance with some embodiments. The openings 132 and the trench 134 partially expose the seed layer 120 over the conductive pads 117a and 117b, in accordance with some embodiments. The trench 134 surrounds the openings 132, in accordance with some embodiments. The mask layer 130 is made of a polymer material such as a photoresist material, in accordance with some embodiments.

As shown in FIGS. 1A and 1A-1, a conductive layer 140 is formed in the openings 132 and the trench 134, in accordance with some embodiments. The conductive layer 140 in each opening 132 forms a conductive bump 142, in accordance with some embodiments. The conductive layer 140 in the trench 134 forms a ring-like structure 144, in accordance with some embodiments. The ring-like structure 144 surrounds the conductive bumps 142, in accordance with some embodiments.

In some embodiments, a line width W1 of the ring-like structure 144 is greater than a width W2 of the conductive bump 142. The conductive layer 140 is formed using an electroplating process, in accordance with some embodiments. The ring-like structure 144 and the conductive bumps 142 are formed simultaneously, in accordance with some embodiments.

In the electroplating process, since the width (i.e. W1) of the trench 134 is greater than the width (i.e. W2) of the opening 132, the plating current density applied on the seed layer 120 under the trench 134 is less than the plating current density applied on the seed layer 120 under the opening 132, in accordance with some embodiments. Therefore, the thickness T1 of the ring-like structure 144 is less than the thickness T2 of the conductive bump 142, in accordance with some embodiments.

In general, the region of the interconnect layer 116 adjacent to predetermined scribe lines SC is a bump-less region, and peripheral conductive bumps adjacent to the bump-less region may tend to be thicker than central conductive bumps relatively far from the bump-less region, which may affect the coplanarity of the conductive bumps. The ring-like structure 144 is formed to surround the conductive bumps 142 so as to separate the conductive bumps 142 from the bump-less region, in accordance with some embodiments. Therefore, the coplanarity of the conductive bumps 142 is improved, in accordance with some embodiments. As a result, the yield of a subsequent bonding process for bonding the conductive bumps 142 to a substrate is improved.

Since the width (i.e. W1) of the trench 134 is greater than the width (i.e. W2) of the opening 132, the plating current density applied on the seed layer 120 exposed by the trench 134 is less than the plating current density applied on the seed layer 120 exposed by the opening 132, in accordance with some embodiments. Therefore, the thickness T1 of the ring-like structure 144 is less than the thickness T2 of the conductive bump 142, in accordance with some embodiments.

The ring-like structure 144 is a continuous ring structure, which continuously surrounds all of the conductive bumps 142, in accordance with some embodiments. The conductive layer 140 is made of a conductive material such as copper (Cu), aluminum (Al), tungsten (W), cobalt (Co), or nickel (Ni), in accordance with some embodiments.

As shown in FIGS. 1A and 1A-1, a solder layer 150 is formed over the conductive bumps 142 and the ring-like structure 144, in accordance with some embodiments. The solder layer 150 is made of tin (Sn) or another suitable conductive material with a melting point lower than that of the conductive bumps 142, in accordance with some embodiments.

The solder layer 150 is formed using a plating process such as an electroplating process, in accordance with some embodiments. The solder layer 150 over the ring-like structure 144 is wider than the solder layer 150 over the conductive bump 142, in accordance with some embodiments. The solder layer 150 over the ring-like structure 144 is thinner than the solder layer 150 over the conductive bump 142, in accordance with some embodiments.

Figure 1B:
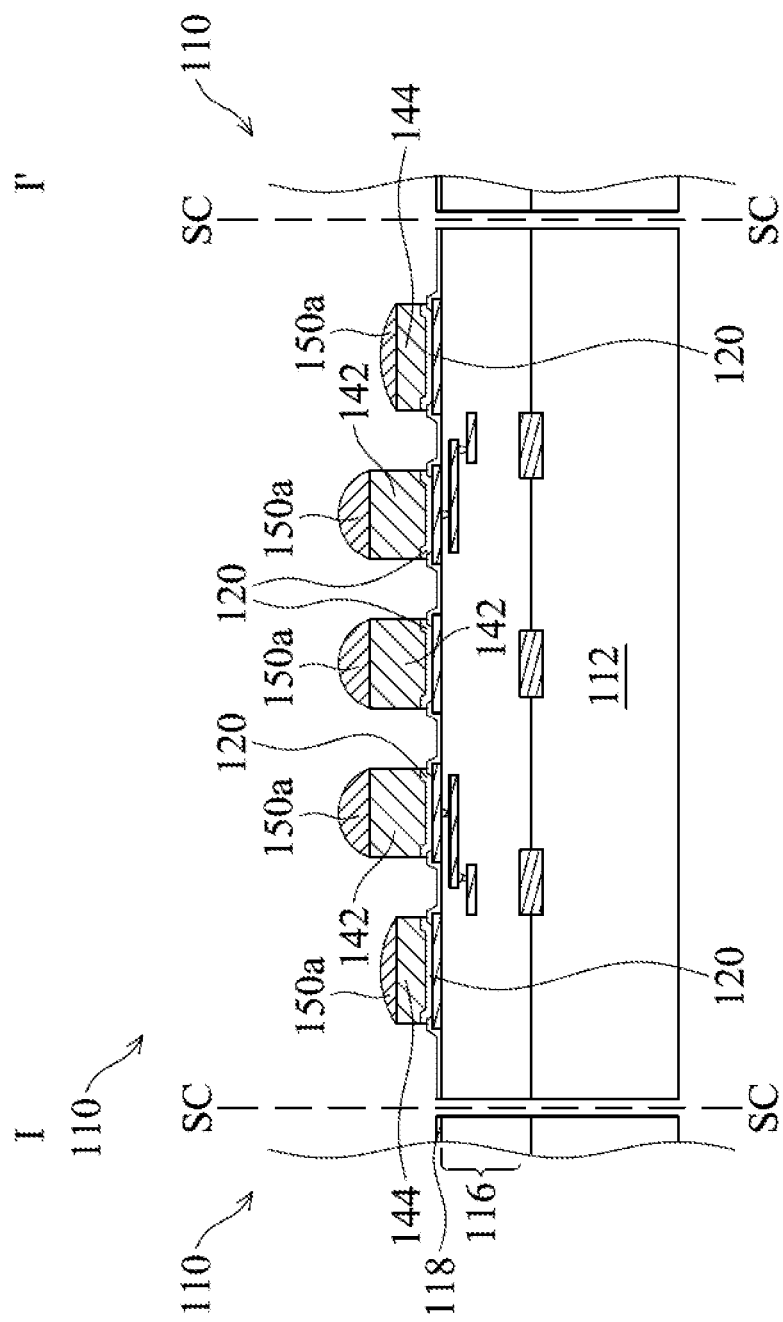
Figures 1, 1B:
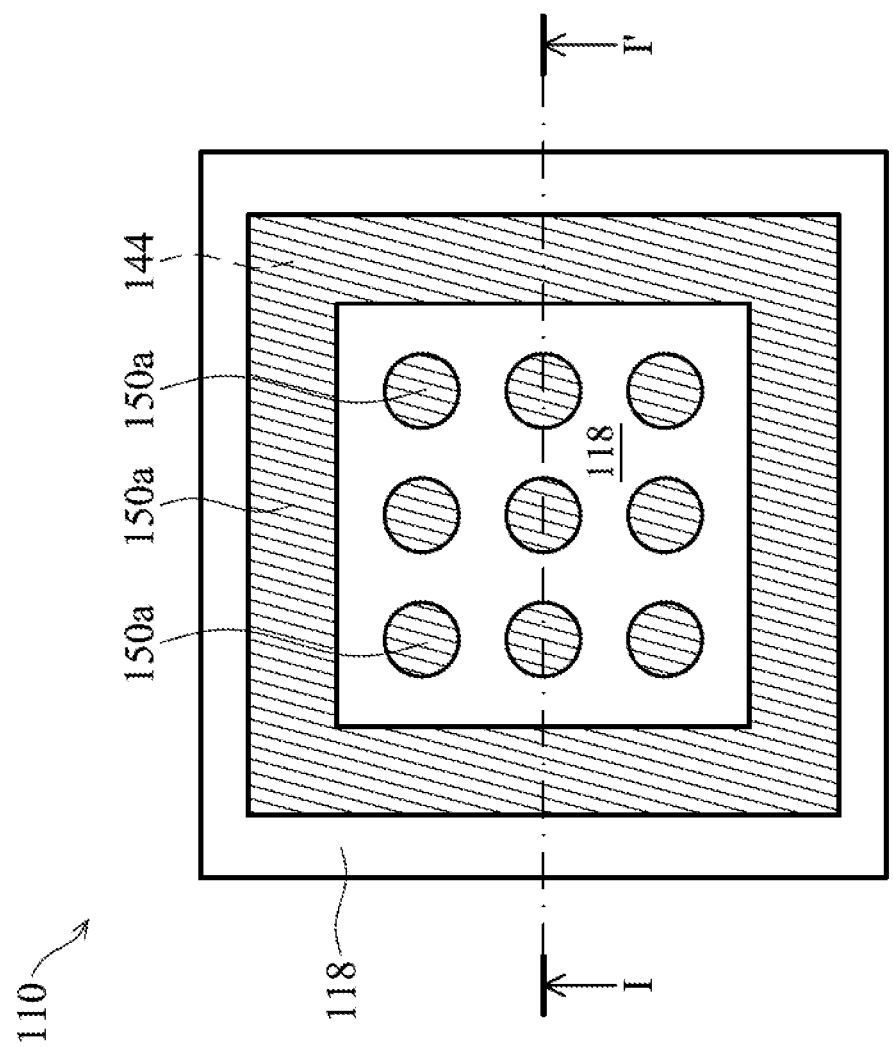

FIG. 1B-1 is a top view of the chip package structure of FIG. 1B, in accordance with some embodiments. FIG. 1B is a cross-sectional view illustrating the chip package structure along a sectional line I-I' in FIG. 1B-1, in accordance with some embodiments. As shown in FIGS. 1B and 1B-1, the mask layer 130 is removed, in accordance with some embodiments. The removal process includes an ash process and/or a flush process, in accordance with some embodiments.

Thereafter, as shown in FIG. 1B, the seed layer 120 originally under the mask layer 130 is removed, in accordance with some embodiments. The removal process includes an etching process such as a wet etching process or a dry etching process, in accordance with some embodiments.

Thereafter, as shown in FIGS. 1A and 1B, a reflow process is performed over the solder layer 150 to convert the solder layer 150 into solder balls 150a, in accordance with some embodiments. As shown in FIG. 1B-1, the solder ball 150a over the ring-like structure 144 is also referred to as a solder bar or a solder ring, in accordance with some embodiments. As shown in FIGS. 1A and 1B, a cutting process is performed to cut through the substrate 112, the interconnect layer 116, and the passivation layer 118 along the predetermined scribe lines SC to form chips 110, in accordance with some embodiments.

Each chip 110 includes a portion of the substrate 112, the devices 114, a portion of the interconnect layer 116, the conductive pads 117a and 117b, and a portion of the passivation layer 118, in accordance with some embodiments. For the sake of simplicity, FIG. 1B-1 only shows one of the chips 110.

Figure 1C:
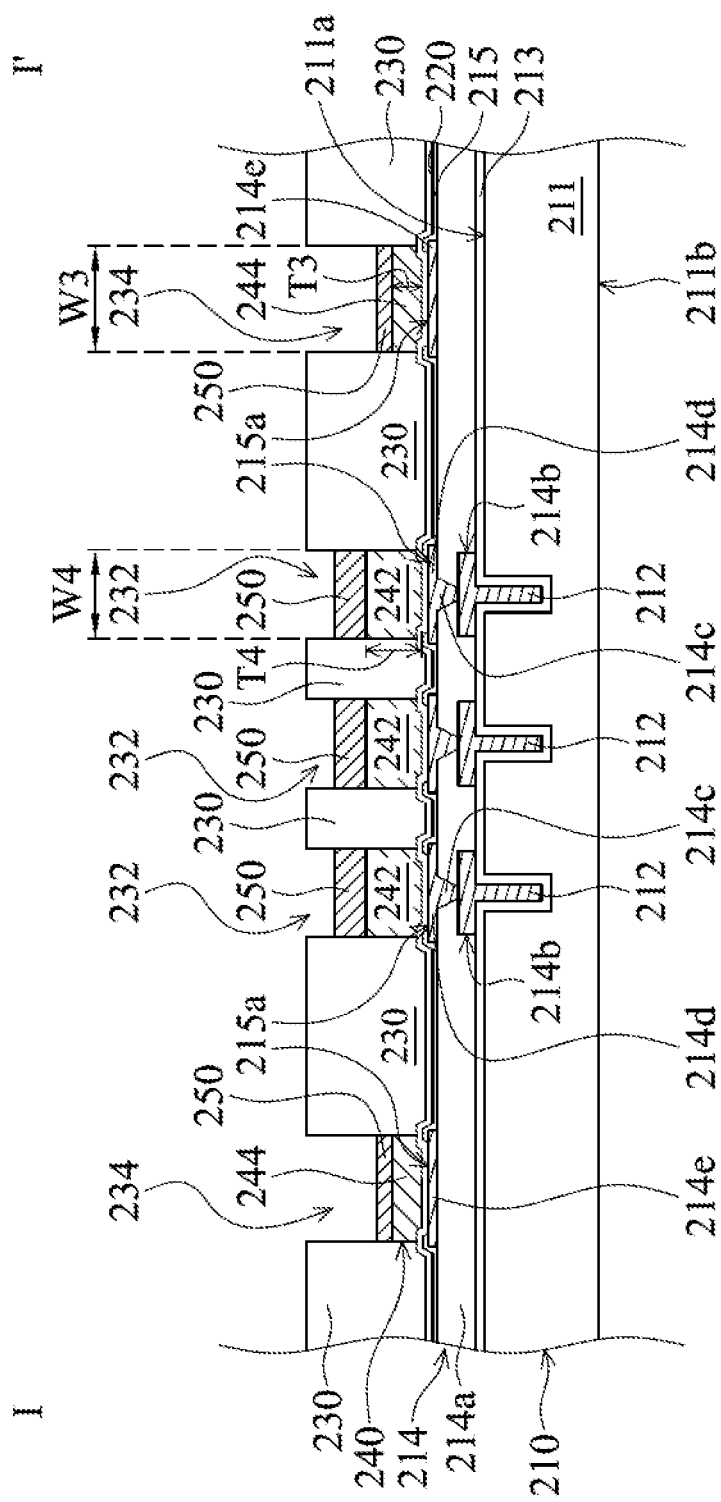
Figures 1, 1C:
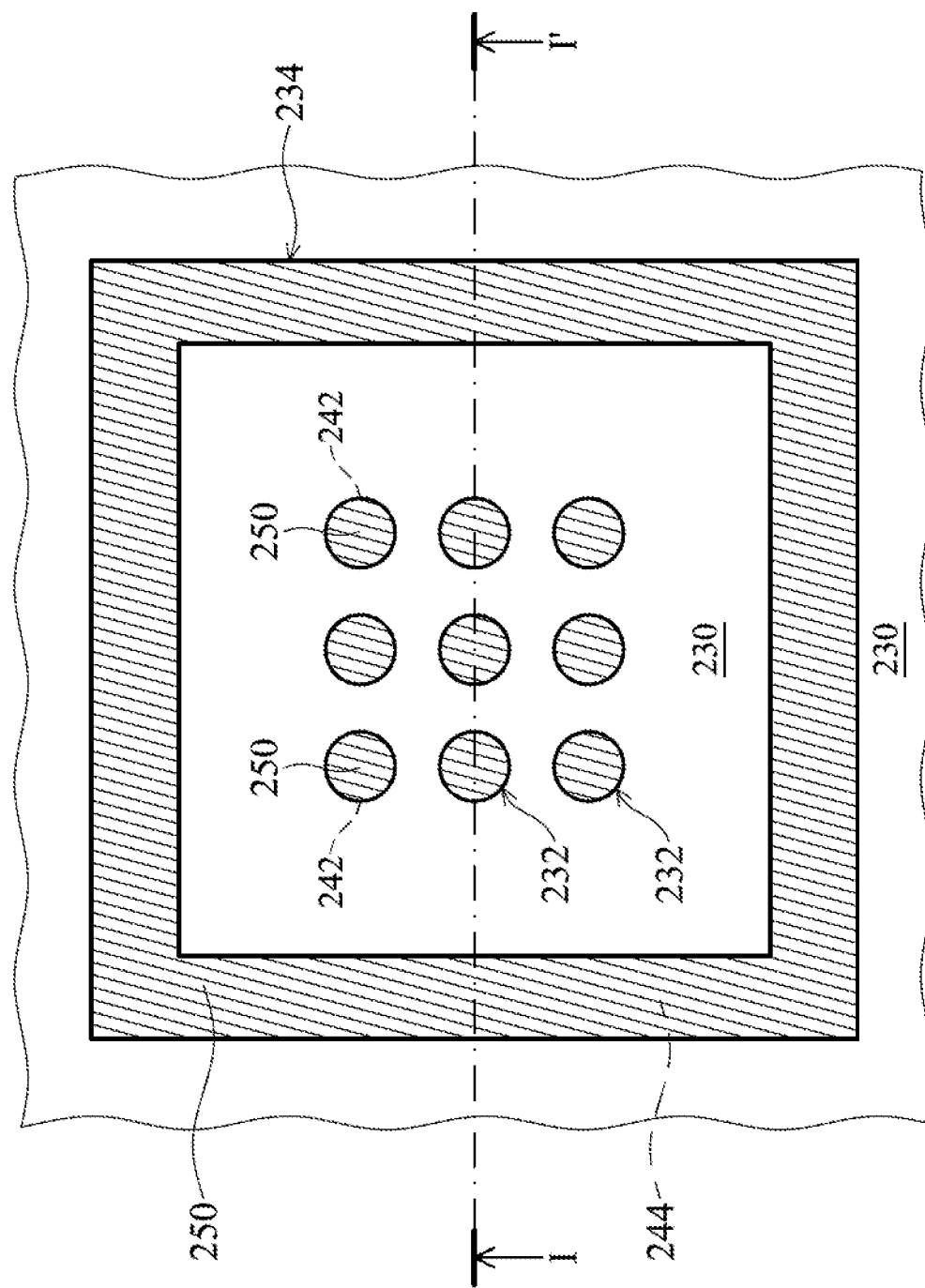

FIG. 1C-1 is a top view of the chip package structure of FIG. 1C, in accordance with some embodiments. FIG. 1C is a cross-sectional view illustrating the chip package structure along a sectional line I-I' in FIG. 1C-1, in accordance with some embodiments. As shown in FIGS. 1C and 1C-1, a substrate 210 is provided, in accordance with some embodiments. In some embodiments, the substrate 210 is an interposer wafer. The substrate 210 includes a semiconductor substrate 211, conductive via structures 212, a barrier layer 213, a redistribution structure 214, and a passivation layer 215, in accordance with some embodiments.

The semiconductor substrate 211 has surfaces 211a and 211b, in accordance with some embodiments. In some embodiments, the semiconductor substrate 211 is made of an elementary semiconductor material including silicon or germanium in a single crystal, polycrystal, or amorphous structure.

In some other embodiments, the semiconductor substrate 211 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor substrate 211 may also include multi-layer semiconductors, semiconductor on insulator (SOI) (such as silicon on insulator or germanium on insulator), or a combination thereof.

The conductive via structures 212 are formed in the semiconductor substrate 211, in accordance with some embodiments. The conductive via structures 212 may be formed to extend from the surface 211a into the semiconductor substrate 211. The barrier layer 213 is formed over the semiconductor substrate 211, in accordance with some embodiments. The barrier layer 213 is between the conductive via structures 212 and the semiconductor substrate 211, in accordance with some embodiments.

The barrier layer 213 is configured to prevent the material of the conductive via structures 212 from diffusing into the semiconductor substrate 211, in accordance with some embodiments. The barrier layer 213 is further configured to electrically insulate the conductive via structures 212 from the semiconductor substrate 211, in accordance with some embodiments.

The barrier layer 213 is made of a silicon-containing material such as silicon nitride, silicon oxide, silicon oxynitride, silicon carbide, the like, or a combination thereof, in accordance with some embodiments. In some other embodiments, the barrier layer 213 is made of phosphosilicate glass (PSG), borosilicate glass (BSG), boron-doped phosphosilicate glass (BPSG), fluorine-doped silicate glass (FSG), tetraethyl orthosilicate (TEOS), or the like.

The barrier layer 213 is formed using an oxidation process, a deposition process, a spin-on coating process, or another suitable process. The deposition process includes a chemical vapor deposition (CVD) process such as a flowable chemical vapor deposition (FCVD) process, a plasma enhanced chemical vapor deposition (PECVD) process, a low pressure chemical vapor deposition (LPCVD) process, or the like, in accordance with some embodiments.

In some embodiments, the substrate 210 is a device wafer that includes various device elements. In some embodiments, the various device elements are formed in and/or over the semiconductor substrate 211. The device elements are not shown in figures for the purpose of simplicity and clarity. Examples of the various device elements include active devices, passive devices, other suitable elements, or a combination thereof. The active devices may include transistors or diodes (not shown) formed at the surface 211a. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 211. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof.

The redistribution structure 214 is formed over the semiconductor substrate 211, in accordance with some embodiments. The redistribution structure 214 includes an insulating layer 214a, wiring layers 214b, conductive vias 214c, and conductive pads 214d and 214e, in accordance with some embodiments. The insulating layer 214a is formed over the surface 211a, in accordance with some embodiments. The wiring layers 214b are formed in the insulating layer 214a, in accordance with some embodiments.

As shown in FIG. 1C, the conductive vias 214c are electrically connected between different wiring layers 214b and between the wiring layer 214b and the conductive pads 214d, in accordance with some embodiments. For the sake of simplicity, FIG. 1C only shows one of the wiring layers 214b, in accordance with some embodiments.

The conductive via structures 212 are electrically connected to the conductive pads 214d through the wiring layers 214b and the conductive vias 214c, in accordance with some embodiments. The conductive pads 214d are formed over the insulating layer 214a, in accordance with some embodiments. The conductive pad 214e is electrically insulated from the conductive vias 214c and the wiring layers 214b, in accordance with some embodiments.

The conductive via structures 212, the wiring layers 214b, the conductive vias 214c, and the conductive pads 214d are made of a conductive material, such as copper (Cu), aluminum (Al), tungsten (W), cobalt (Co), nickel (Ni), or another suitable material, in accordance with some embodiments.

As shown in FIG. 1C, a passivation layer 215 is formed over the redistribution structure 214 to cover edge portions of the conductive pads 214d and 214e, in accordance with some embodiments. The passivation layer 215 has openings 215a partially exposing the conductive pads 214d and 214e, in accordance with some embodiments. The passivation layer 215 is made of polyimide, silicon oxide, silicon nitride, un-doped silicate glass (USG), or another suitable dielectric material, in accordance with some embodiments.

As shown in FIG. 1C, a seed layer 220 is formed over the passivation layer 215 and the conductive pads 214d and 214e, in accordance with some embodiments. The materials of the seed layer 220 include titanium, copper, or the like, in accordance with some embodiments. The seed layer 220 is formed using a physical vapor deposition (PVD) process such as a sputtering process, in accordance with some embodiments.

FIG. 1C-1 is a top view of the chip package structure of FIG. 1C, in accordance with some embodiments. FIG. 1C is a cross-sectional view illustrating the chip package structure along a sectional line I-I' in FIG. 1C-1, in accordance with some embodiments.

As shown in FIGS. 1C and 1C-1, a mask layer 230 is formed over the seed layer 220, in accordance with some embodiments. The mask layer 230 has openings 232 and a trench 234, in accordance with some embodiments. The openings 232 and the trench 234 partially expose the seed layer 220 over the conductive pads 214d and 214e, in accordance with some embodiments. The trench 234 surrounds the openings 232, in accordance with some embodiments. The mask layer 230 is made of a polymer material such as a photoresist material, in accordance with some embodiments.

As shown in FIGS. 1C and 1C-1, a conductive layer 240 is formed in the openings 232 and the trench 234, in accordance with some embodiments. The conductive layer 240 in each opening 232 forms a conductive bump 242, in accordance with some embodiments. The conductive layer 240 in the trench 234 forms a ring-like structure 244, in accordance with some embodiments. The ring-like structure 244 surrounds the conductive bumps 242, in accordance with some embodiments.

In some embodiments, a line width W3 of the ring-like structure 244 is greater than a width W4 of the conductive bump 242. The conductive layer 240 is formed using an electroplating process, in accordance with some embodiments. The ring-like structure 244 and the conductive bumps 242 are formed simultaneously, in accordance with some embodiments.

In the electroplating process, since the width (i.e. W3) of the trench 234 is greater than the width (i.e. W4) of the opening 232, the plating current density applied on the seed layer 220 under the trench 234 is less than the plating current density applied on the seed layer 220 under the opening 232, in accordance with some embodiments. Therefore, the thickness T3 of the ring-like structure 244 is less than the thickness T4 of the conductive bump 242, in accordance with some embodiments.

The ring-like structure 244 is a continuous ring structure, which continuously surrounds all of the conductive bumps 242, in accordance with some embodiments. The conductive layer 240 is made of a conductive material such as copper (Cu), aluminum (Al), tungsten (W), cobalt (Co), or nickel (Ni), in accordance with some embodiments.

As shown in FIGS. 1C and 1C-1, a solder layer 250 is formed over the conductive bumps 242 and the ring-like structure 244, in accordance with some embodiments. The solder layer 250 is made of tin (Sn) or another suitable conductive material with a melting point lower than that of the conductive bumps 242, in accordance with some embodiments.

The solder layer 250 is formed using a plating process such as an electroplating process, in accordance with some embodiments. The solder layer 250 over the ring-like structure 244 is wider than the solder layer 250 over the conductive bump 242, in accordance with some embodiments. The solder layer 250 over the ring-like structure 244 is thinner than the solder layer 250 over the conductive bump 242, in accordance with some embodiments.

Figure 1D:
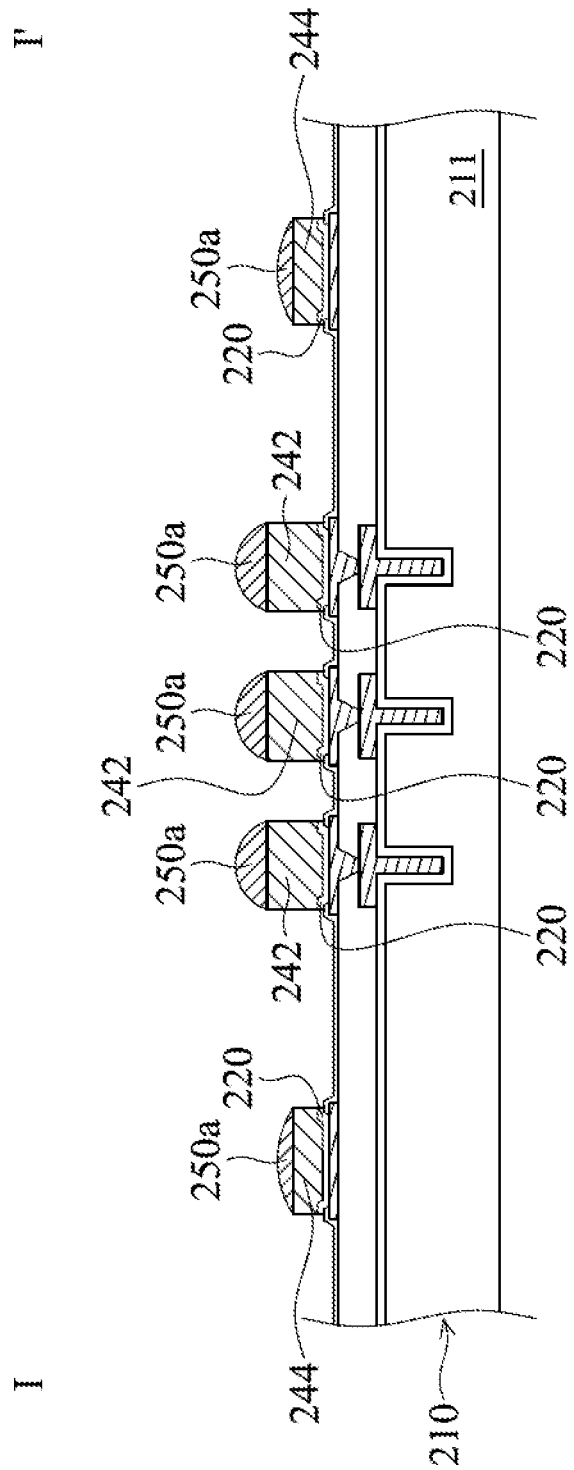
Figures 1, 1D:
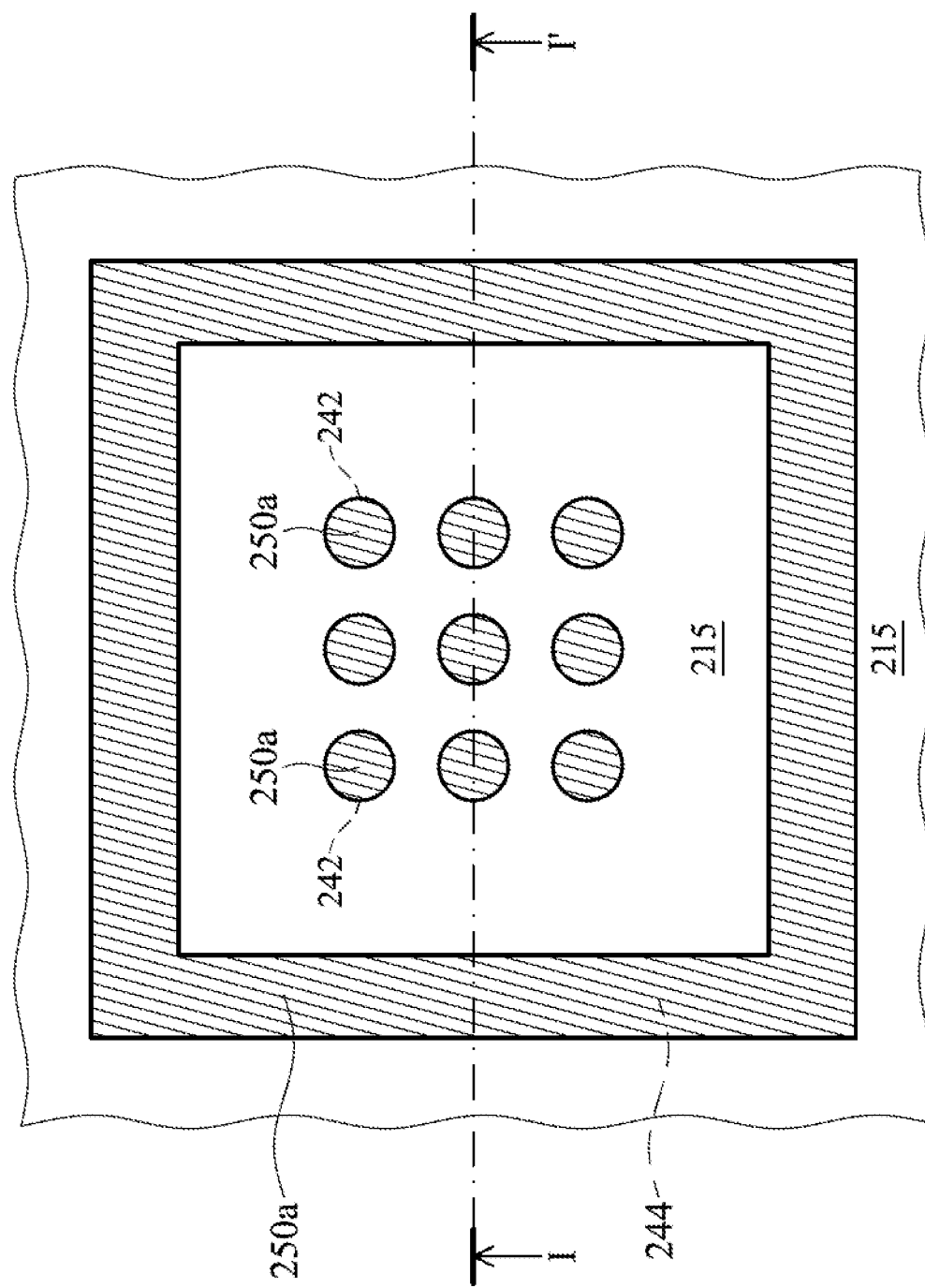

FIG. 1D-1 is a top view of the chip package structure of FIG. 1D, in accordance with some embodiments. FIG. 1D is a cross-sectional view illustrating the chip package structure along a sectional line I-I' in FIG. 1D-1, in accordance with some embodiments. As shown in FIGS. 1D and 1D-1, the mask layer 230 is removed, in accordance with some embodiments. The removal process includes an ash process and/or a flush process, in accordance with some embodiments.

Thereafter, as shown in FIG. 1D, the seed layer 220 originally under the mask layer 230 is removed, in accordance with some embodiments. The removal process includes an etching process such as a wet etching process or a dry etching process, in accordance with some embodiments. Thereafter, as shown in FIGS. 1C and 1D, a reflow process is performed over the solder layer 250 to convert the solder layer 250 into solder balls 250a, in accordance with some embodiments. As shown in FIG. 1D-1, the solder ball 250a over the ring-like structure 244 is also referred to as a solder bar or a solder ring, in accordance with some embodiments.

Figure 1E:
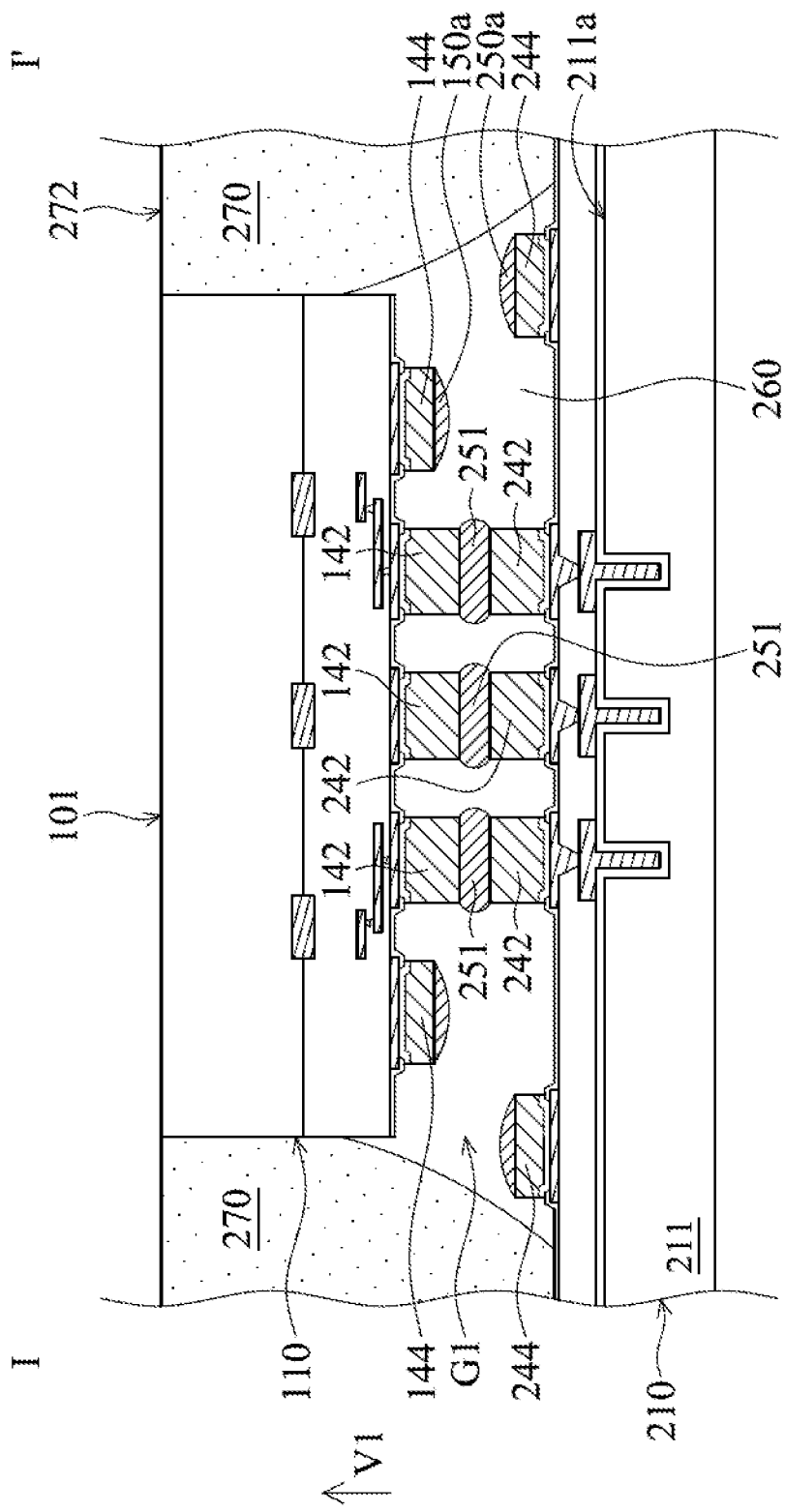
Figures 1, 1E:
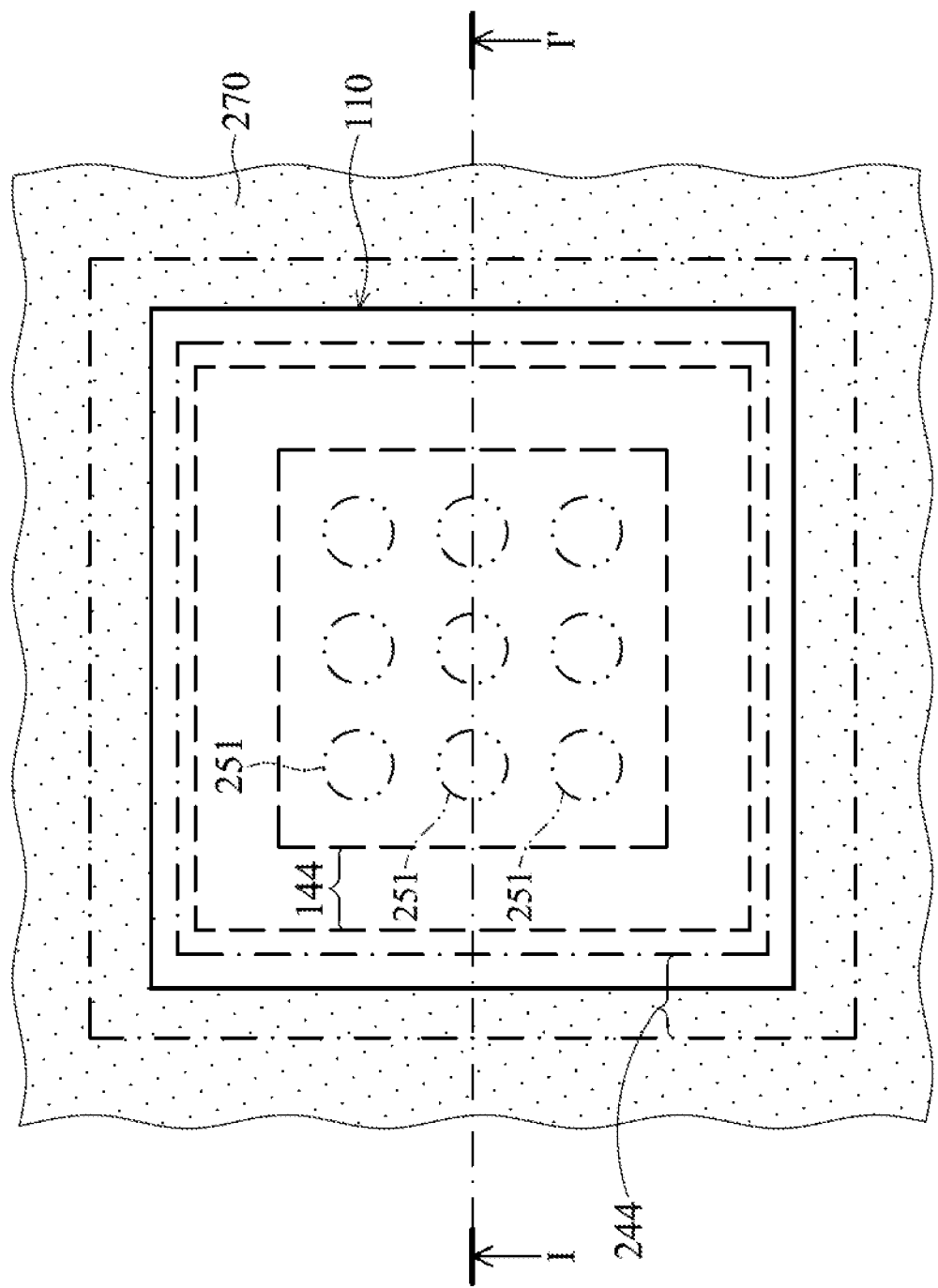

As shown in FIG. 1E, the chip 110 is disposed over the substrate 210, in accordance with some embodiments. Thereafter, as shown in FIGS. 1B, 1D, and 1E, a reflow process is performed over the solder balls 150a and 250a, in accordance with some embodiments. After the reflow process, each solder ball 150a and the solder ball 250a thereunder melt and mix together to form a solder ball 251, in accordance with some embodiments. Therefore, the chip 110 is bonded to the substrate 210 through the bumps 142 and 242 and the solder balls 251, in accordance with some embodiments.

After the chip 110 is bonded to the substrate 210, the ring-like structure 144 is electrically insulated from the substrate 210, in accordance with some embodiments. The ring-like structure 244 is electrically insulated from the chip 110, in accordance with some embodiments.

FIG. 1E-1 is a top view of the chip package structure of FIG. 1E, in accordance with some embodiments. FIG. 1E is a cross-sectional view illustrating the chip package structure along a sectional line I-I' in FIG. 1E-1, in accordance with some embodiments.

As shown in FIGS. 1E and 1E-1, the ring-like structure 244 (or the solder ball 250a connected to the ring-like structure 244) is not overlapped by the ring-like structure 144 (or the solder ball 150a connected to the ring-like structure 144), in accordance with some embodiments. That is, the ring-like structures 144 and 244 are misaligned in a vertical direction V1 perpendicular to the surface 211a of the semiconductor substrate 211, in accordance with some embodiments.

As shown in FIG. 1E, an underfill layer 260 is formed into a gap G1 between the substrate 210 and the chip 110, in accordance with some embodiments. The underfill layer 260 surrounds the bumps 142 and 242 and the ring-like structures 144 and 244, the solder balls 251, and the chip 110, in accordance with some embodiments. A portion of the underfill layer 260 is between the ring-like structure 144 and the substrate 210, in accordance with some embodiments.

A portion of the underfill layer 260 is between the ring-like structure 244 and the chip 110, in accordance with some embodiments. A portion of the underfill layer 260 is between the ring-like structures 144 and 244, in accordance with some embodiments. A portion of the underfill layer 260 is between the solder balls 150a and 250a, in accordance with some embodiments. The underfill layer 260 includes a polymer material, in accordance with some embodiments.

As shown in FIGS. 1E and 1E-1, a molding layer 270 is formed over the substrate 210, in accordance with some embodiments. The molding layer 270 surrounds the chip 110, the underfill layer 260, the ring-like structures 144 and 244, the bumps 142 and 242, and the solder balls 251, in accordance with some embodiments. The molding layer 270 includes a polymer material, in accordance with some embodiments.

The formation of the molding layer 270 includes forming a molding material layer (not shown) over the substrate 210, the underfill layer 260, and the chip 110; and performing a planarization process over the molding material layer to remove an upper portion of the molding material layer until a top surface 101 of the chip 110 is exposed, in accordance with some embodiments. The top surface 101 and 272 of the chip 110 and the molding layer 270 are substantially coplanar, in accordance with some embodiments.

Figure 1F:
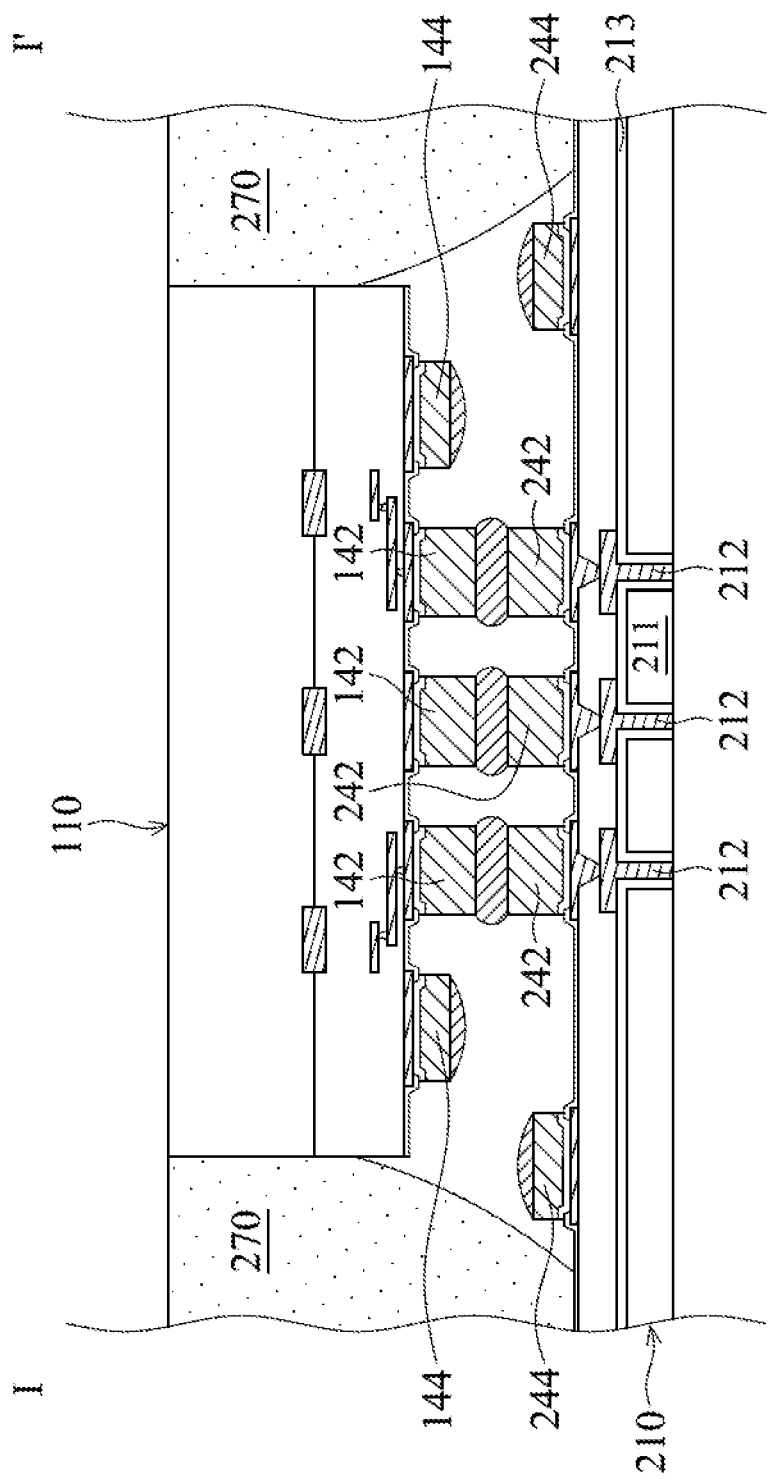

As shown in FIG. 1F, a lower portion of the semiconductor substrate 211 is removed, in accordance with some embodiments. The removal process includes a chemical mechanical polishing (CMP) process, in accordance with some embodiments. After the removal process, the conductive via structures 212 and the barrier layer 213 are exposed, in accordance with some embodiments.

The conductive via structures 212 and the barrier layer 213 pass through the semiconductor substrate 211, in accordance with some embodiments. The conductive via structures 212 are also referred to as through-substrate vias or through-silicon vias (TSV) when the semiconductor substrate 211 is a silicon substrate, in accordance with some embodiments.

Figure 1G:
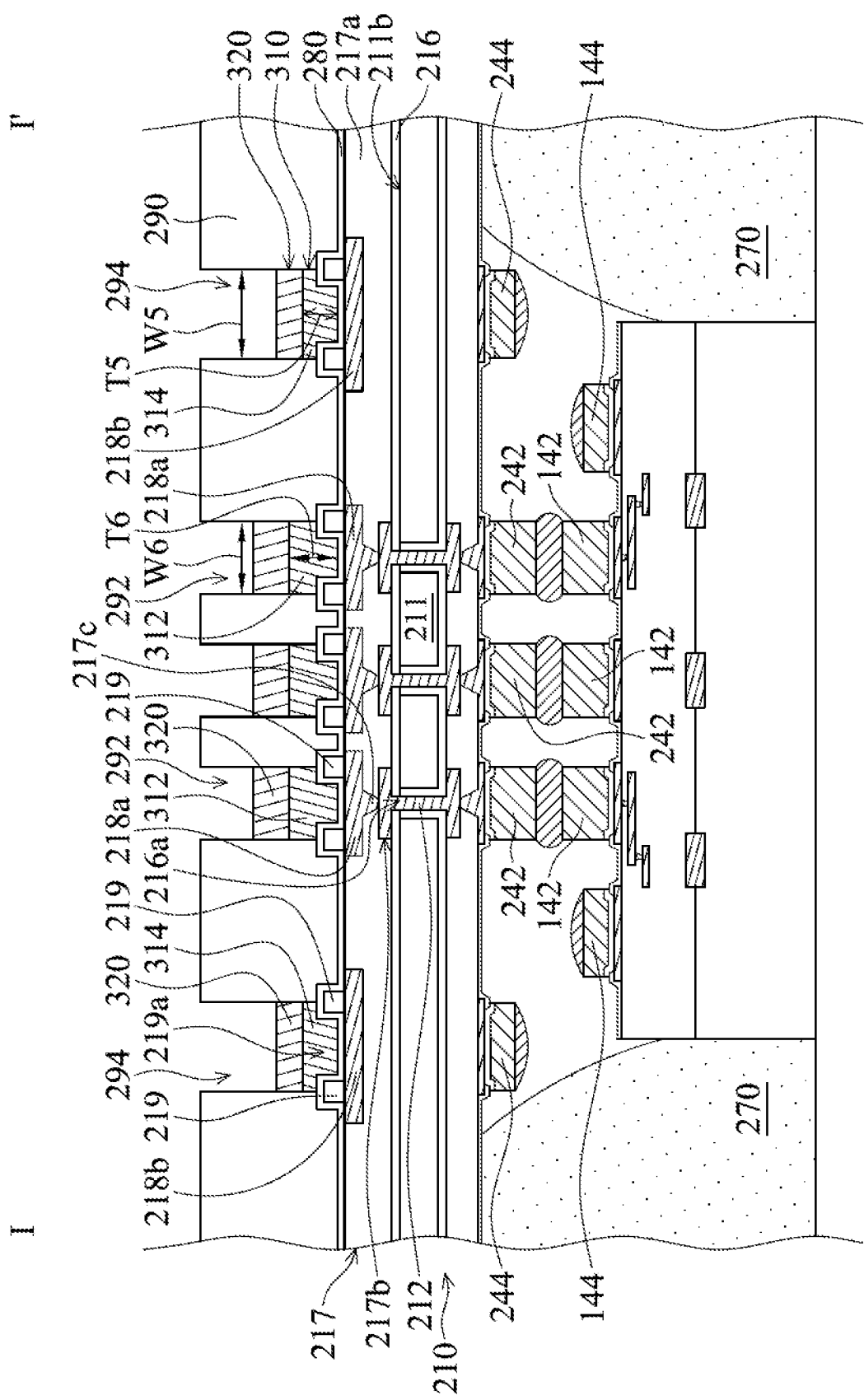
Figures 1, 1G:
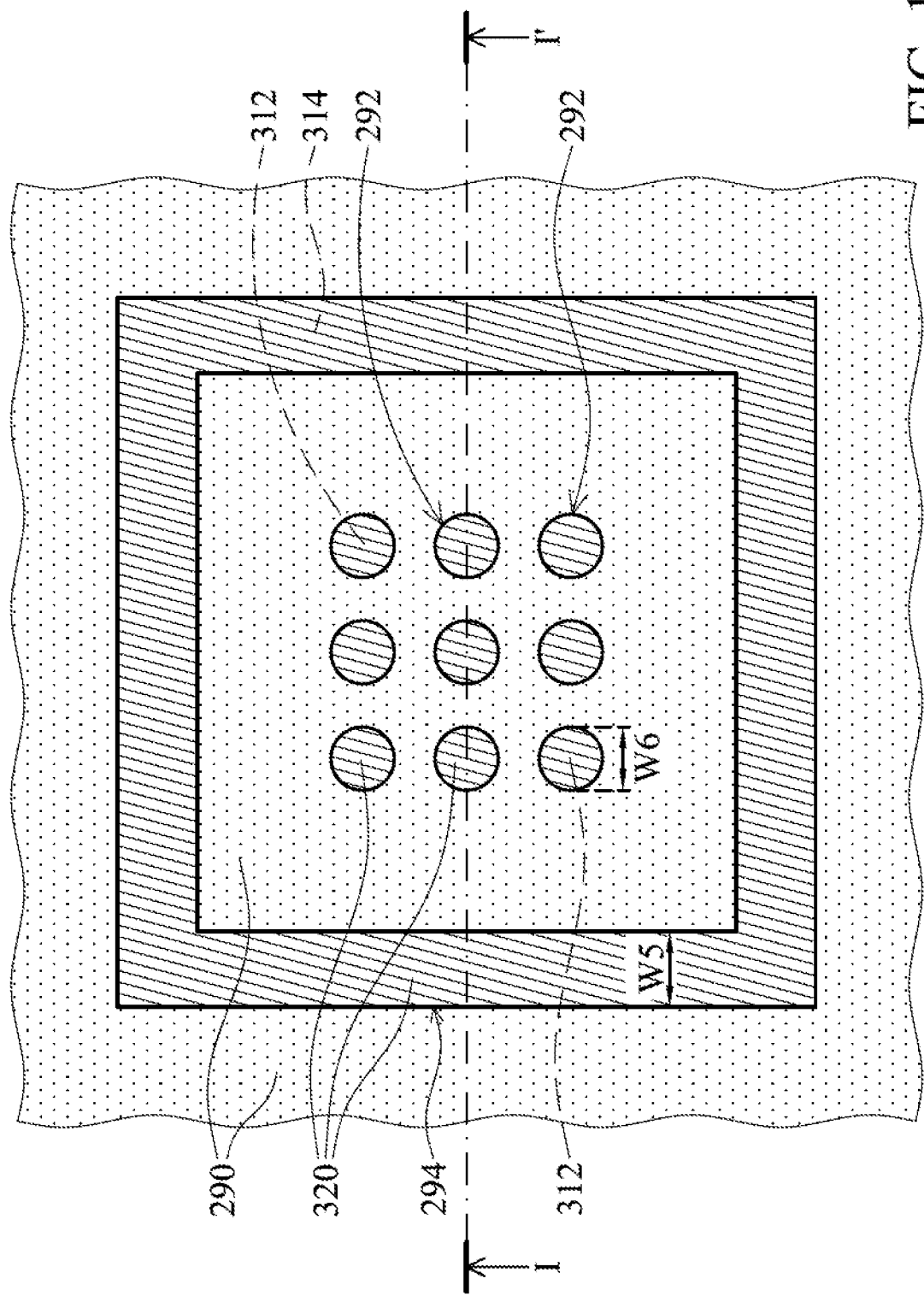

FIG. 1G-1 is a top view of the chip package structure of FIG. 1G, in accordance with some embodiments. FIG. 1G is a cross-sectional view illustrating the chip package structure along a sectional line I-I' in FIG. 1G-1, in accordance with some embodiments. As shown in FIGS. 1G and 1G-1, the semiconductor substrate 211 is flipped upside down, in accordance with some embodiments.

As shown in FIG. 1G, an insulating layer 216 is formed over the surface 211b, in accordance with some embodiments. The insulating layer 216 is configured to electrically insulate wiring layers subsequently formed thereon from the semiconductor substrate 211, in accordance with some embodiments. The insulating layer 216 has openings 216a respectively over the conductive via structures 212, in accordance with some embodiments.

The insulating layer 216 is made of a silicon-containing material such as silicon nitride, silicon oxide, silicon oxynitride, silicon carbide, the like, or a combination thereof, in accordance with some embodiments. In some other embodiments, the insulating layer 216 is made of phosphosilicate glass (PSG), borosilicate glass (BSG), boron-doped phosphosilicate glass (BPSG), fluorine-doped silicate glass (FSG), tetraethyl orthosilicate (TEOS), or the like.

The insulating layer 216 is formed using an oxidation process, a deposition process, a spin-on coating process, or another suitable process. The deposition process includes a chemical vapor deposition (CVD) process such as a flowable chemical vapor deposition (FCVD) process, a plasma enhanced chemical vapor deposition (PECVD) process, a low pressure chemical vapor deposition (LPCVD) process, or the like, in accordance with some embodiments. The openings 216a are formed using a photolithography process and an etching process, in accordance with some embodiments.

In some embodiments, a redistribution structure 217 is formed over the surface 211b of the semiconductor substrate 211, in accordance with some embodiments. The redistribution structure 217 includes a dielectric layer 217a, wiring layers 217b, and conductive vias 217c, in accordance with some embodiments. The wiring layers 217b and the conductive vias 217c are formed in the dielectric layer 217a, in accordance with some embodiments.

As shown in FIG. 1G, pads 218a and 218b are formed over the redistribution structure 217, in accordance with some embodiments. The conductive vias 217c are electrically connected between different wiring layers 217b and between the wiring layer 217b and the conductive pads 218a, in accordance with some embodiments. For the sake of simplicity, FIG. 1G only shows one of the wiring layers 217b, in accordance with some embodiments.

The conductive pads 218b are electrically insulated from the conductive vias 217c and the wiring layers 217b, in accordance with some embodiments. The conductive via structures 212 are electrically connected to the conductive pads 218a through the wiring layers 217b and the conductive vias 217c, in accordance with some embodiments.

As shown in FIG. 1G, buffer rings 219 are formed over the conductive pads 218a and 218b, in accordance with some embodiments. The buffer ring 219 has an opening 219a exposing the conductive pad 218a or 218b thereunder, in accordance with some embodiments. The buffer rings 219 are configured to buffer the stress between the substrate 210 and bumps subsequently formed thereover, in accordance with some embodiments.

The buffer rings 219 are made of an elastic material such as a polymer material (e.g., polyimide), in accordance with some embodiments. In some other embodiments (not shown), the buffer rings 219 are replaced with a buffer layer having openings exposing the conductive pads 218a and 218b.

As shown in FIG. 1G, a seed layer 280 is formed over the redistribution structure 217, the conductive pads 218a and 218b, and the buffer rings 219, in accordance with some embodiments. The materials of the seed layer 280 may include copper or copper alloys. The materials of the seed layer 280 may include other metals, such as silver, gold, aluminum, and combinations thereof.

As shown in FIG. 1G, a mask layer 290 is formed over the seed layer 280, in accordance with some embodiments. The mask layer 290 has openings 292 and a trench 294 exposing the seed layer 280 over the conductive pads 218a and 218b and the buffer rings 219 adjacent to the conductive pads 218a and 218b, in accordance with some embodiments. The mask layer 290 is made of a polymer material such as a photoresist material, in accordance with some embodiments.

As shown in FIG. 1G, a conductive layer 310 is formed in the openings 292 and the trench 294, in accordance with some embodiments. The conductive layer 310 in each opening 292 forms a conductive bump 312, in accordance with some embodiments. The conductive layer 310 in the trench 294 forms a ring-like structure 314, in accordance with some embodiments. The ring-like structure 314 surrounds the conductive bumps 312, in accordance with some embodiments. The ring-like structure 314 is electrically insulated from the chip 110 and the conductive bumps 312, 242, and 142, in accordance with some embodiments.

In some embodiments, a line width W5 of the ring-like structure 314 is greater than a width W6 of the conductive bump 312. The conductive layer 310 is formed using an electroplating process, in accordance with some embodiments. The ring-like structure 314 and the conductive bumps 312 are formed simultaneously, in accordance with some embodiments.

In the electroplating process, since the width (i.e. W5) of the trench 294 is greater than the width (i.e. W6) of the opening 292, the plating current density applied on the seed layer 280 under the trench 294 is less than the plating current density applied on the seed layer 280 under the opening 292, in accordance with some embodiments. Therefore, the thickness T5 of the ring-like structure 314 is less than the thickness T6 of the conductive bump 312, in accordance with some embodiments.

The ring-like structure 314 is a continuous ring structure, which continuously surrounds all of the conductive bumps 312, in accordance with some embodiments. The conductive layer 310 is made of a conductive material such as copper (Cu), aluminum (Al), tungsten (W), cobalt (Co), or nickel (Ni), in accordance with some embodiments.

As shown in FIGS. 1G and 1G-1, a solder layer 320 is formed over the conductive bumps 312 and the ring-like structure 314, in accordance with some embodiments. The solder layer 320 is made of tin (Sn) or another suitable conductive material with a melting point lower than that of the conductive bumps 312, in accordance with some embodiments.

The solder layer 320 is formed using a plating process such as an electroplating process, in accordance with some embodiments. The solder layer 320 over the ring-like structure 314 is wider than the solder layer 320 over the conductive bump 312, in accordance with some embodiments. The solder layer 320 over the ring-like structure 314 is thinner than the solder layer 320 over the conductive bump 312, in accordance with some embodiments.

Figure 1H:
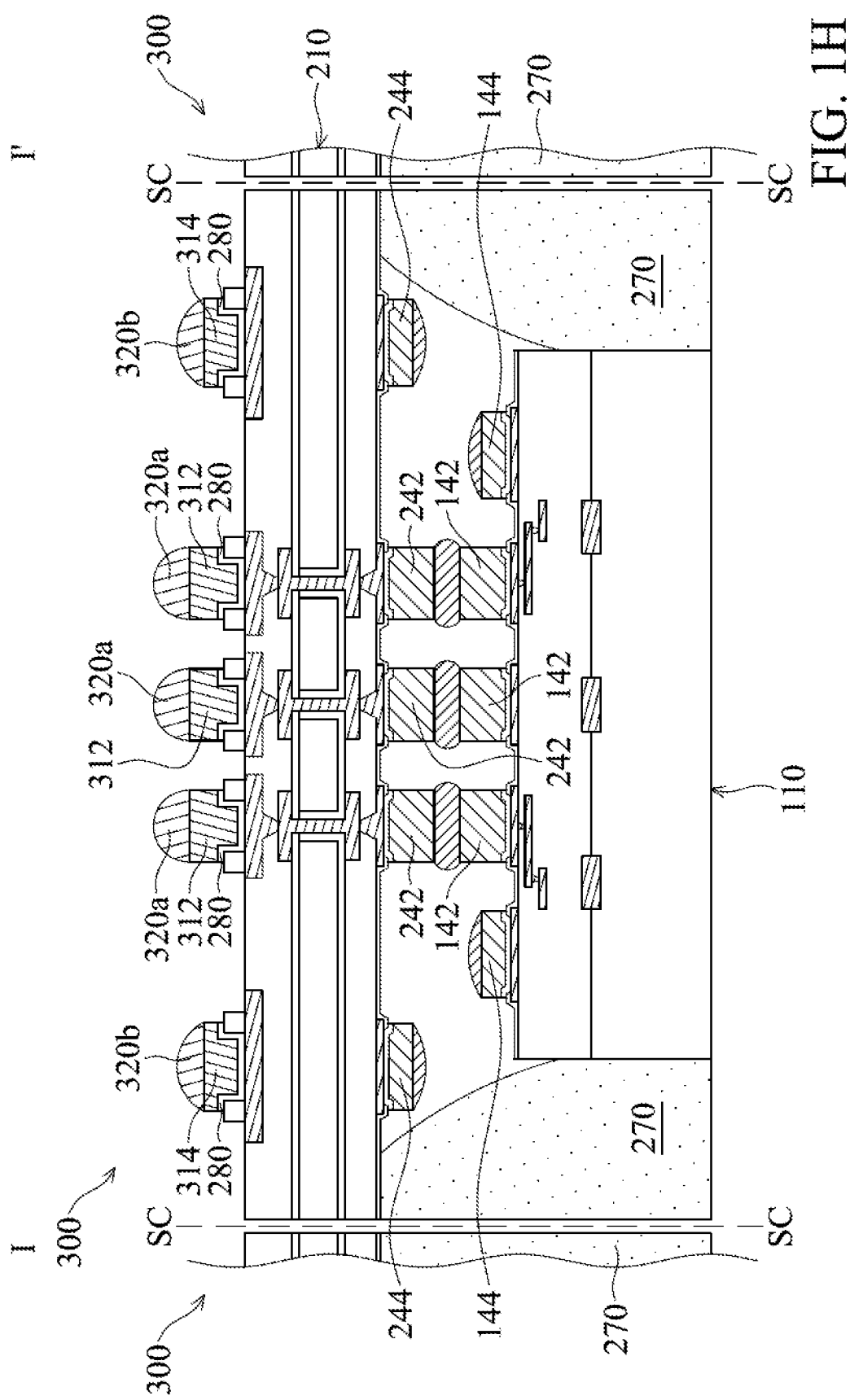
Figures 1, 1H:
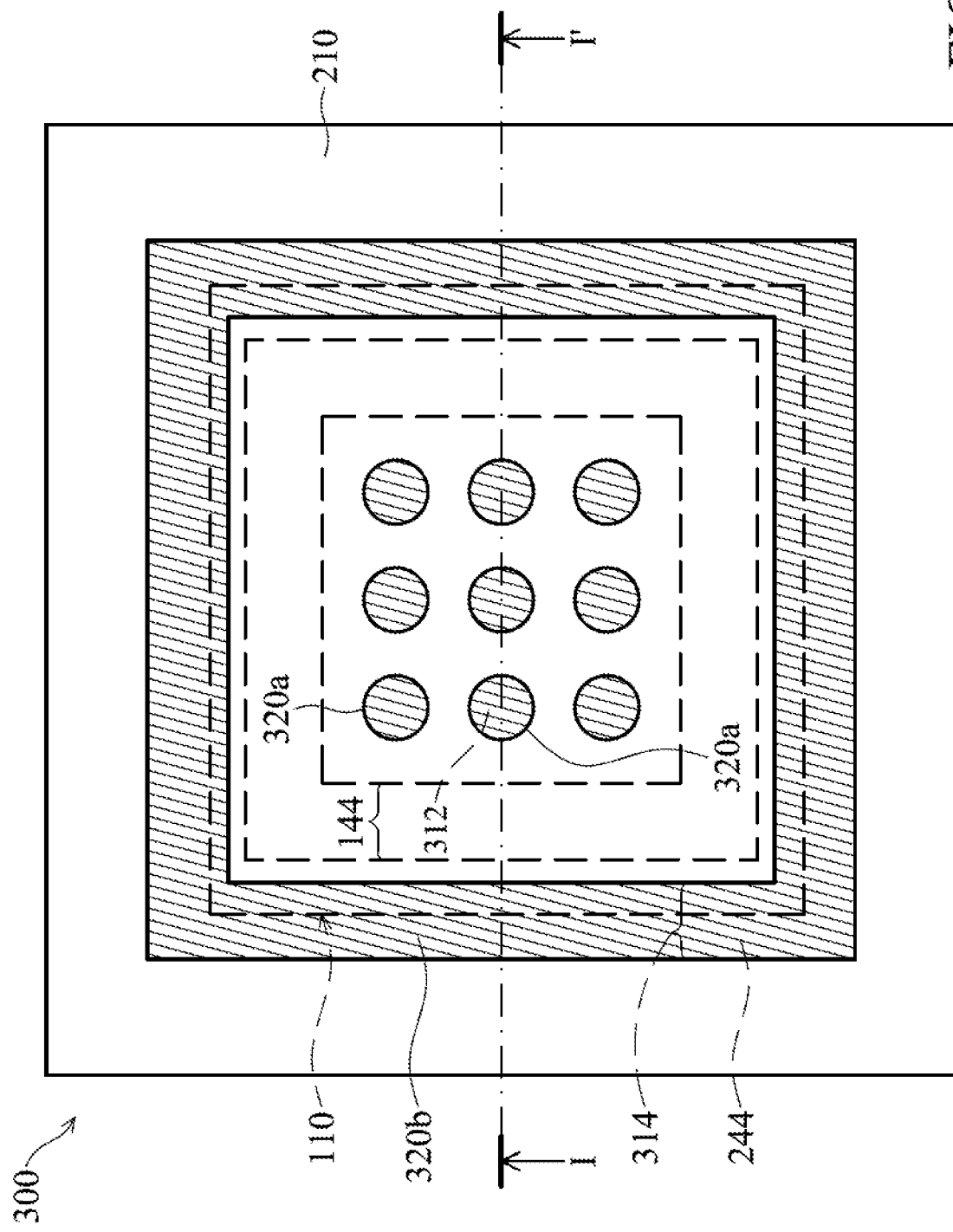

FIG. 1H-1 is a top view of the chip package structure of FIG. 1H, in accordance with some embodiments. FIG. 1H is a cross-sectional view illustrating the chip package structure along a sectional line I-I' in FIG. 1H-1, in accordance with some embodiments. As shown in FIGS. 1G, 1H and 1H-1, the mask layer 290 is removed, in accordance with some embodiments. The removal process includes an ash process and/or a flush process, in accordance with some embodiments.

Thereafter, as shown in FIG. 1H, the seed layer 280 originally under the mask layer 290 is removed, in accordance with some embodiments. The removal process includes an etching process such as a wet etching process or a dry etching process, in accordance with some embodiments.

Thereafter, as shown in FIGS. 1G and 1H, a reflow process is performed over the solder layer 320 to convert the solder layer 320 into solder balls 320a and 320b, in accordance with some embodiments. The solder balls 320a are over the conductive bumps 312, in accordance with some embodiments. The solder ball 320b is over the ring-like structure 314, in accordance with some embodiments. As shown in FIG. 1H-1, the solder ball 320b is also referred to as a solder bar or a solder ring, in accordance with some embodiments.

As shown in FIG. 1H, a cutting process is performed to cut through the substrate 210 and the molding layer 270 along predetermined scribe lines SC to form chip package structures 300, in accordance with some embodiments. For the sake of simplicity, FIG. 1H-1 only shows one of the chip package structures 300, in accordance with some embodiments.

Figure 1I:
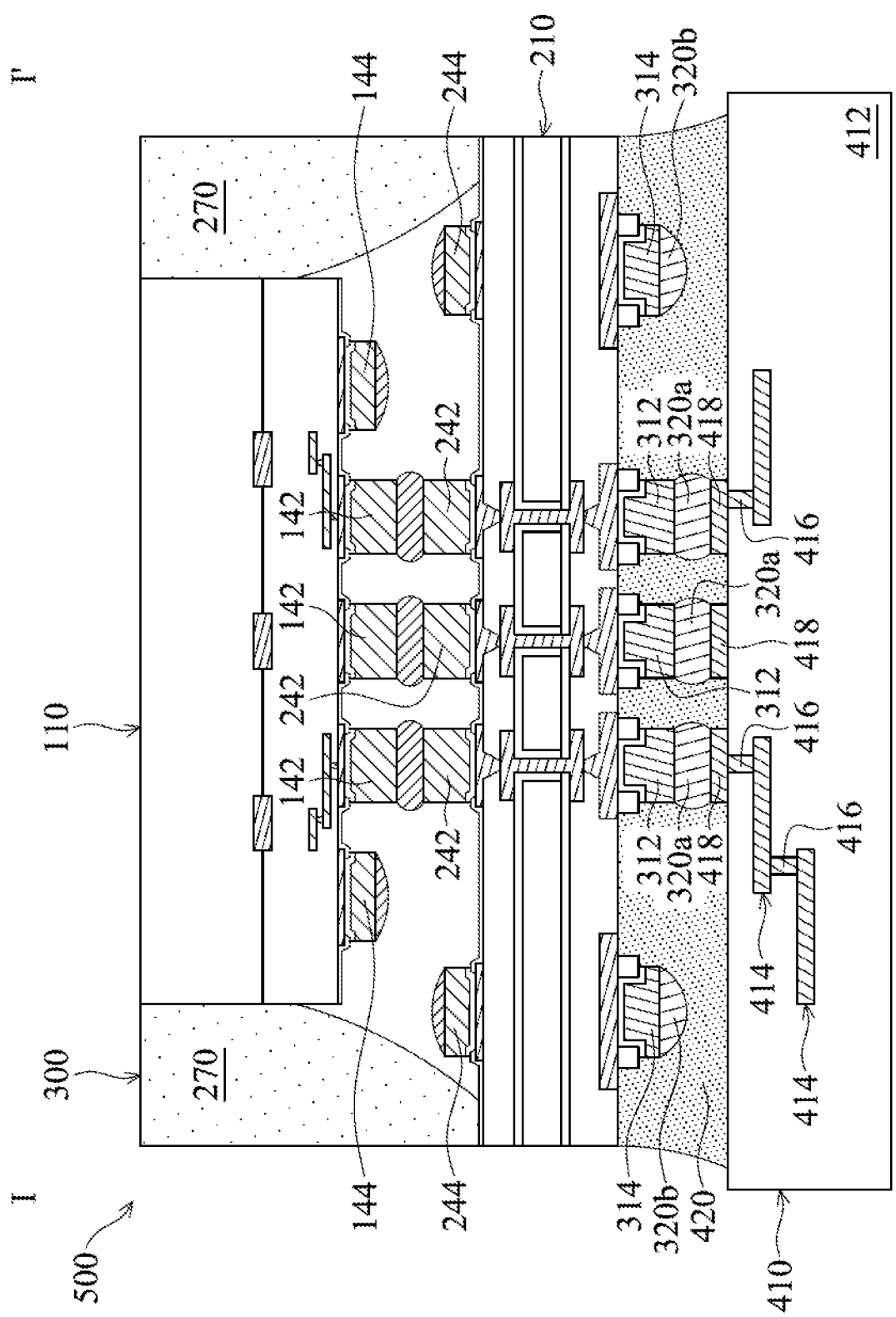
Figures 1, 1I:
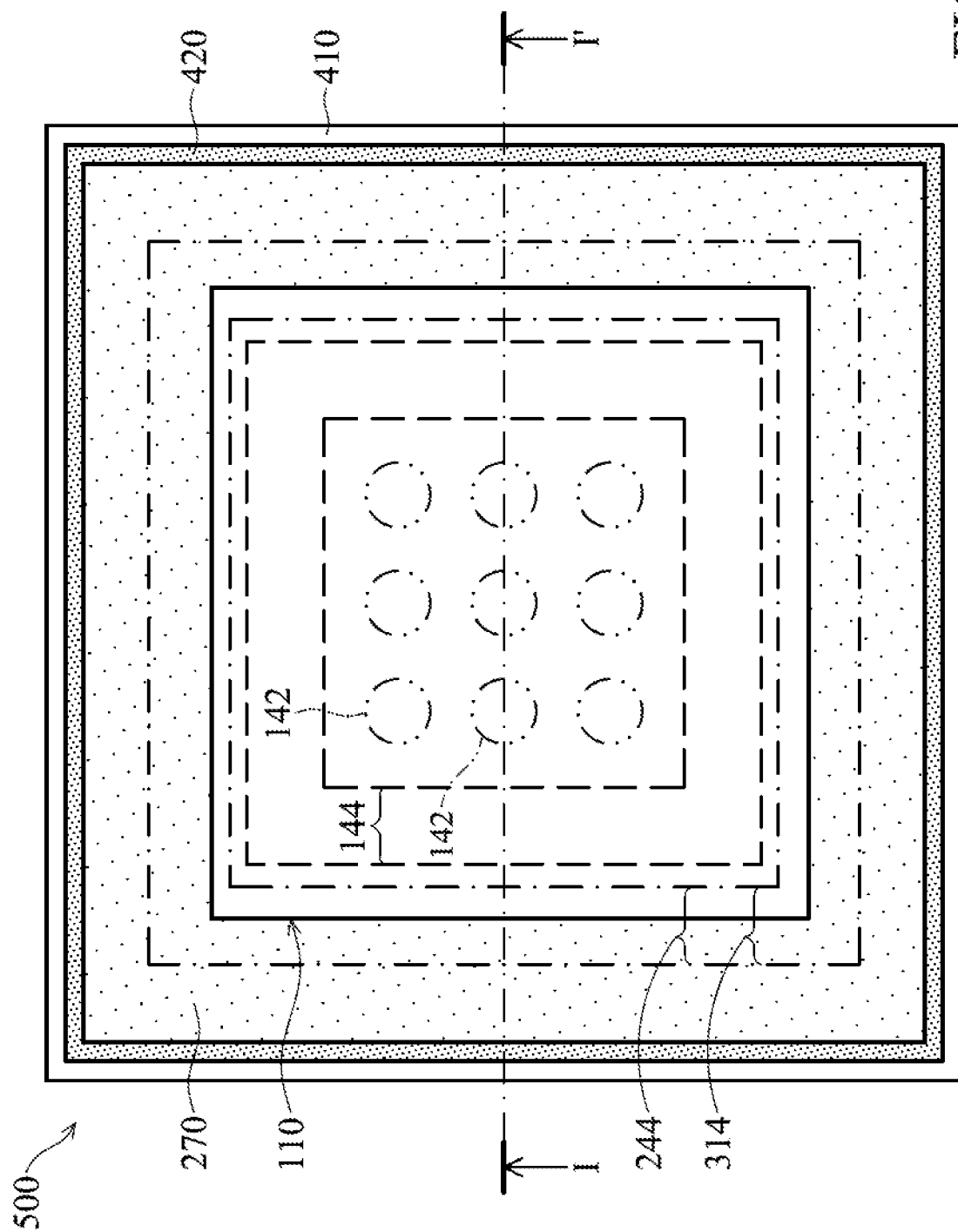

FIG. 1I-1 is a top view of the chip package structure of FIG. 1I, in accordance with some embodiments. FIG. 1I is a cross-sectional view illustrating the chip package structure along a sectional line I-I' in FIG. 1I-1, in accordance with some embodiments. As shown in FIGS. 1I and 1I-1, the chip package structure 300 is flipped upside down, in accordance with some embodiments.

As shown in FIG. 1I, the chip package structure 300 is bonded to a substrate 410 through the solder balls 320a, in accordance with some embodiments. The solder ball 320b is spaced apart from the substrate 410, in accordance with some embodiments. The solder ball 320b and the ring-like structure 314 are electrically insulated from the substrate 410 and the chip 110, in accordance with some embodiments.

The conductive bumps 142 and 242 are micro-bumps, in accordance with some embodiments. The conductive bumps 312 are controlled collapse chip connection (C4) bumps, in accordance with some embodiments. The conductive bump 312 is wider than the conductive bump 142 or 242, in accordance with some embodiments.

The substrate 410 includes an insulating layer 412, wiring layers 414, conductive vias 416, and pads 418, in accordance with some embodiments. The wiring layers 414 are formed in the insulating layer 412, in accordance with some embodiments. The conductive pads 418 are formed over the insulating layer 412, in accordance with some embodiments. The conductive vias 416 are electrically connected between different wiring layers 414 and between the wiring layers 414 and the conductive pads 418, in accordance with some embodiments.

As shown in FIG. 1I, an underfill layer 420 is formed between the substrates 210 and 410, in accordance with some embodiments. A portion of the underfill layer 420 is between the ring-like structure 314 (or the solder ball 320b) and the substrate 410, in accordance with some embodiments.

In some embodiments, a portion of the underfill layer 420 is formed over the substrate 410 and surrounds the chip package structure 300. The underfill layer 420 is made of an insulating material, such as a polymer material, in accordance with some embodiments. In this step, a chip package structure 500 is substantially formed, in accordance with some embodiments.

Figure 2:
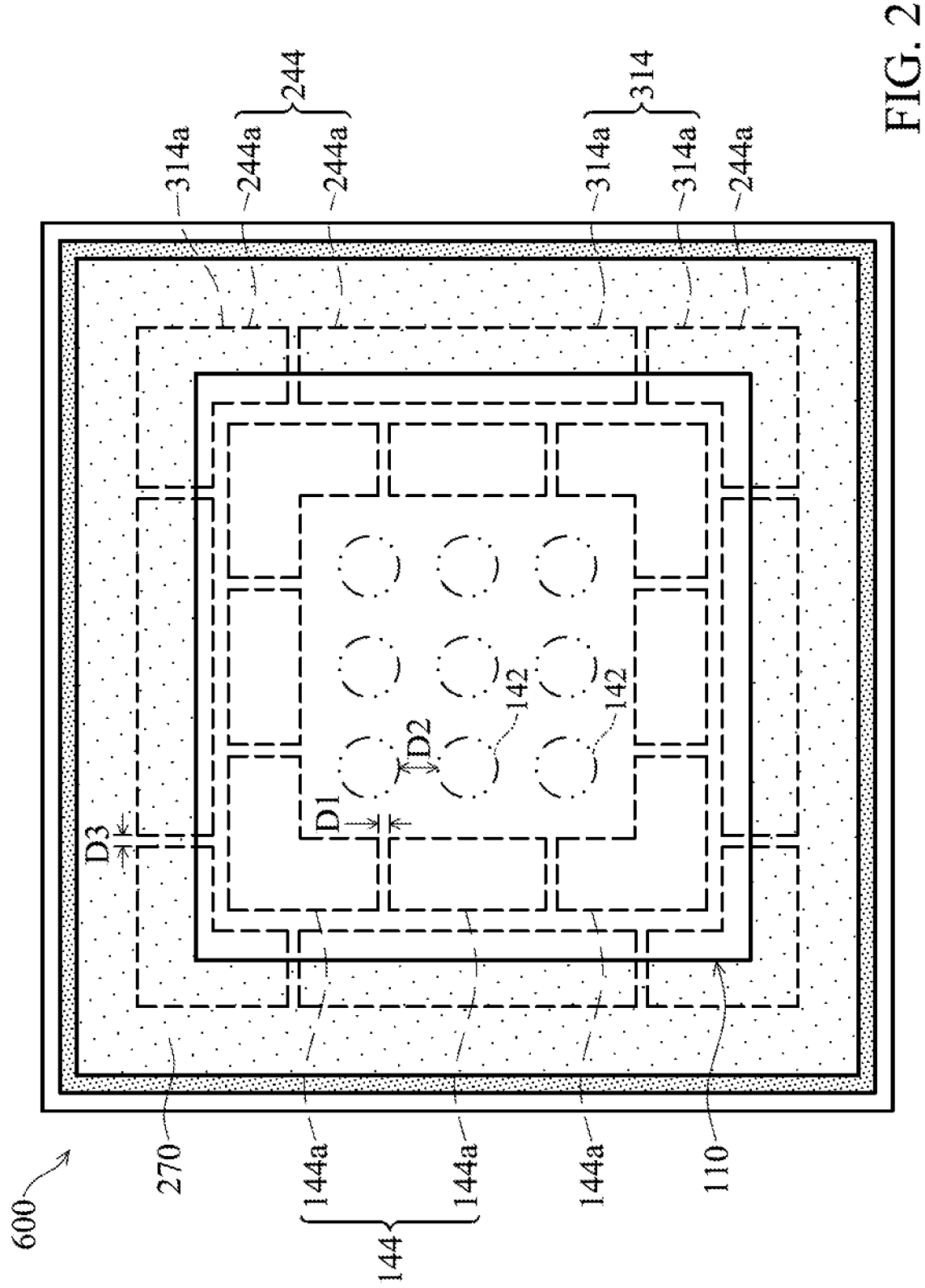
FIG. 2 is a top view of a chip package structure, in accordance with some embodiments.

FIG. 2 is a top view of a chip package structure 600, in accordance with some embodiments. As shown in FIG. 2, the chip package structure 600 is similar to the chip package structure 500 of FIG. 1I-1, except that the ring-like structure 144 of the chip package structure 600 has portions 144a spaced apart from each other, in accordance with some embodiments.

In some embodiments, the portions 144a are spaced apart from each other by a substantially same distance D1. The conductive bumps 142 are spaced apart from each other by a distance D2, in accordance with some embodiments. The distance D1 is less than the distance D2, in accordance with some embodiments. The portions 144a are strip portions, in accordance with some embodiments.

The ring-like structure 244 has portions 244a spaced apart from each other, in accordance with some embodiments. In some embodiments, the portions 244a are spaced apart from each other by a substantially same distance D3. The distance D3 is less than the distance D2, in accordance with some embodiments. The portions 244a are strip portions, in accordance with some embodiments.

The ring-like structure 314 has portions 314a spaced apart from each other, in accordance with some embodiments. In some embodiments, the portions 314a are spaced substantially the same distance D3 apart from each other. The distance D3 is less than the distance D2, in accordance with some embodiments. The portions 314a are strip portions, in accordance with some embodiments.

Figure 3:
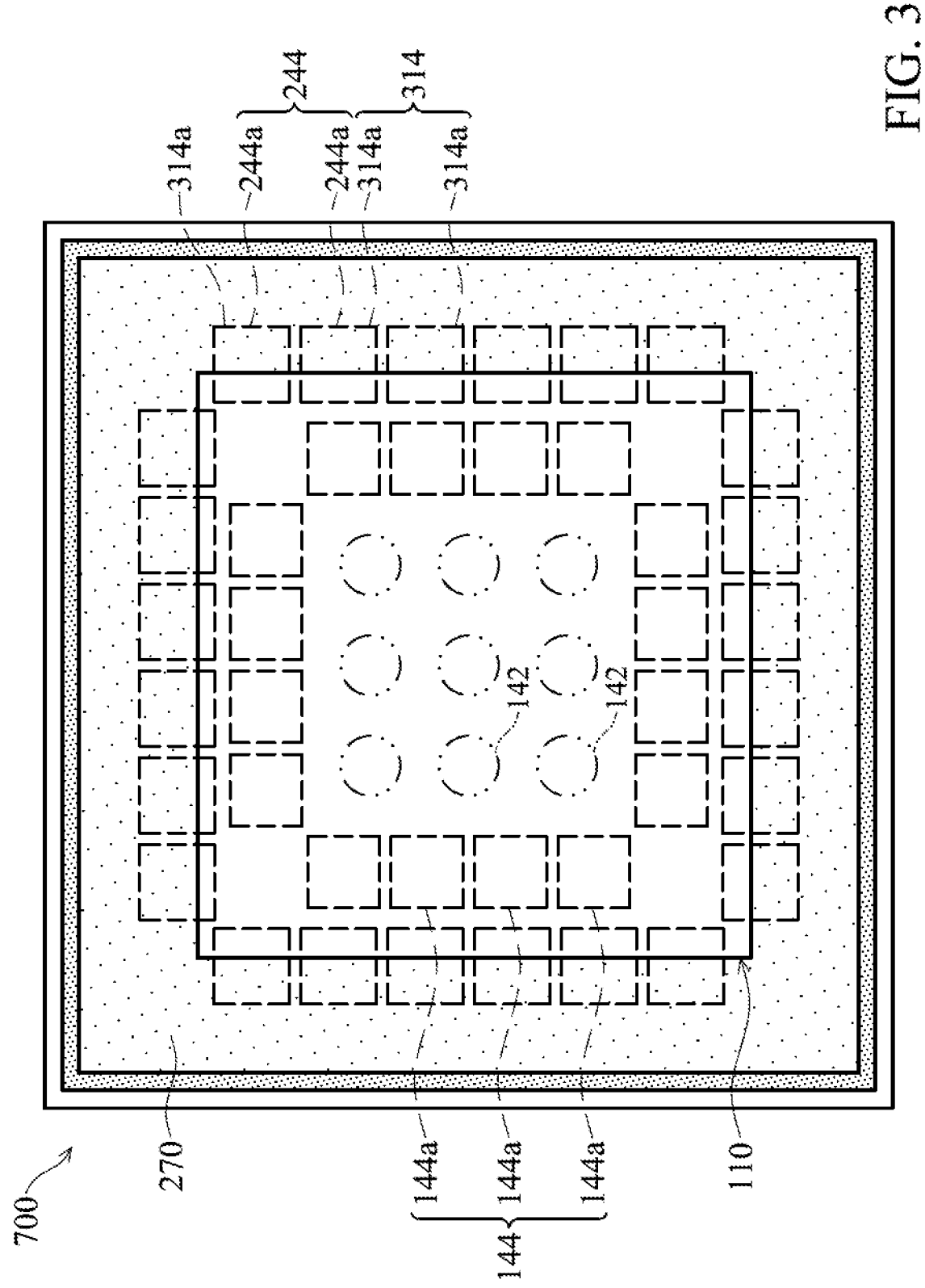
FIG. 3 is a top view of a chip package structure, in accordance with some embodiments.

FIG. 3 is a top view of a chip package structure 700, in accordance with some embodiments. As shown in FIG. 3, the chip package structure 700 is similar to the chip package structure 600 of FIG. 2, except that the portions 144a of the ring-like structure 144 of the chip package structure 700 have a square shape, in accordance with some embodiments.

The portions 244a of the ring-like structure 244 of the chip package structure 700 have a square shape, in accordance with some embodiments. The portions 314a of the ring-like structure 314 of the chip package structure 700 have a square shape, in accordance with some embodiments.

Figure 4:
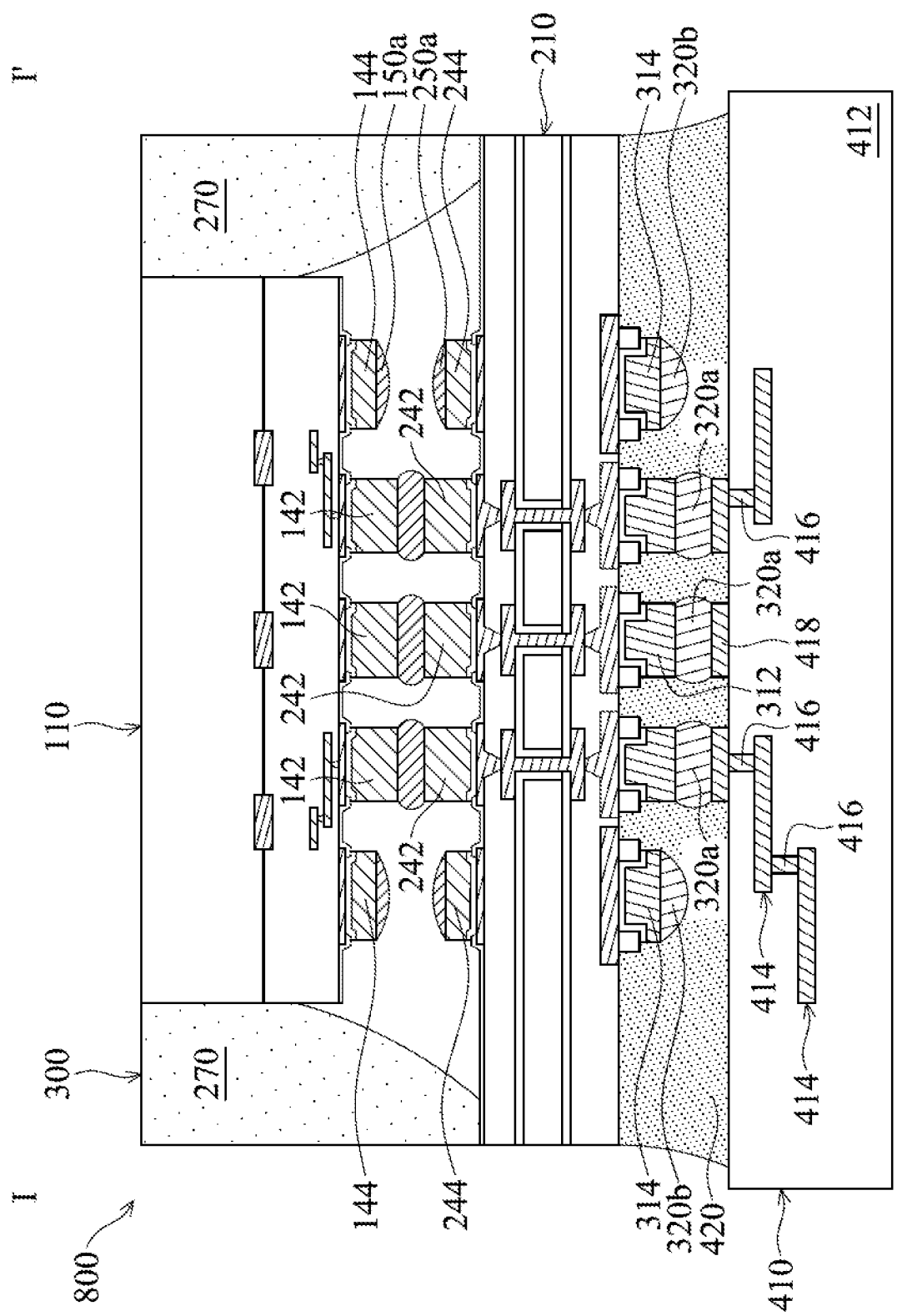
FIG. 4 is a cross-sectional view of a chip package structure, in accordance with some embodiments.

FIG. 4 is a cross-sectional view of a chip package structure 800, in accordance with some embodiments. As shown in FIG. 4, the chip package structure 800 is similar to the chip package structure 500 of FIG. 1I, except that the ring-like structures 144, 244 and 314 of the chip package structure 800 are aligned with each other, in accordance with some embodiments.

Figure 5A:
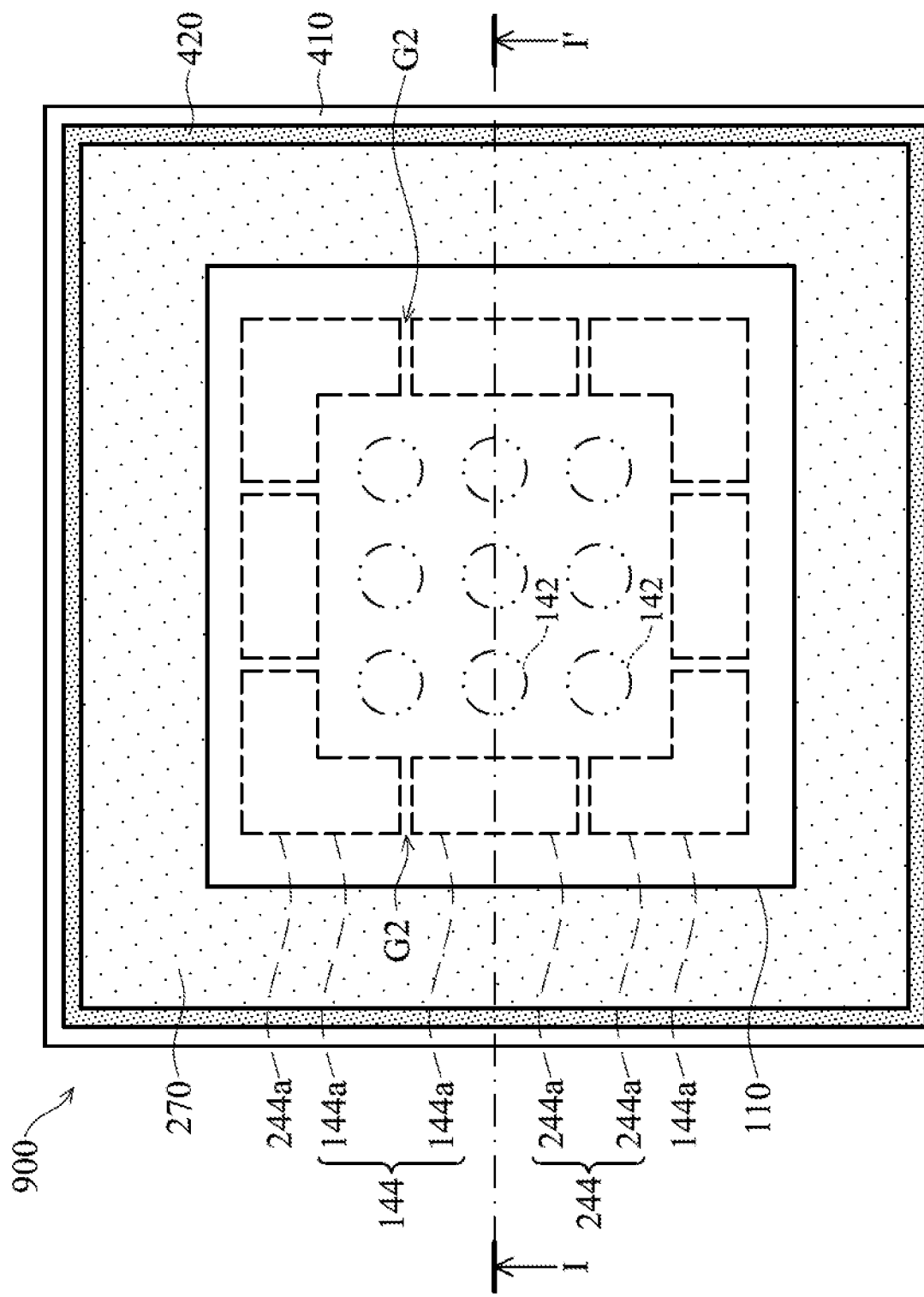
FIG. 5A is a top view of a chip package structure, in accordance with some embodiments.
Figure 5B:
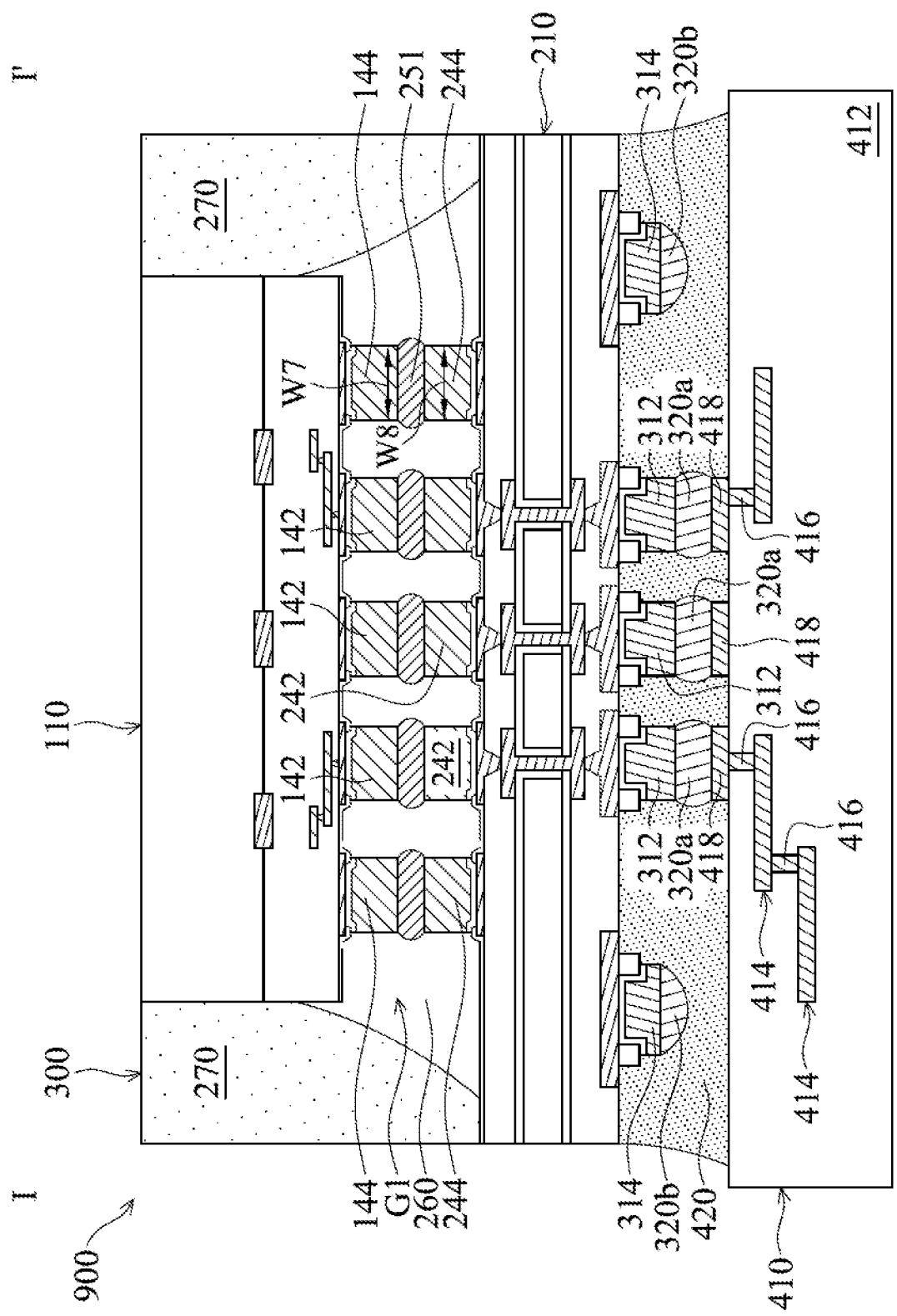
FIG. 5B is a cross-sectional view illustrating the chip package structure along a sectional line I-I' in FIG. 5A, in accordance with some embodiments.

FIG. 5A is a top view of a chip package structure 900, in accordance with some embodiments. FIG. 5B is a cross-sectional view illustrating the chip package structure 900 along a sectional line I-I' in FIG. 5A, in accordance with some embodiments. As shown in FIGS. 5A and 5B, the chip package structure 900 is similar to the chip package structure 800 of FIG. 4, except that the ring-like structure 144 is connected to the ring-like structure 244 through a solder ball 251 therebetween, in accordance with some embodiments.

The ring-like structure 144 and the conductive bumps 142 may have a substantially same thickness by adjusting the width W7 of the ring-like structure 144. The ring-like structure 244 and the conductive bumps 242 may have a substantially same thickness by adjusting the width W8 of the ring-like structure 244.

As shown in FIGS. 5A and 5B, the underfill layer 260 is filled into the gap G1 between the substrate 210 and the chip 110 through the gaps G2 between the portions 144a of the ring-like structure 144 or between the portions 244a of the ring-like structure 244, in accordance with some embodiments.

In accordance with some embodiments, chip package structures and methods for forming the same are provided. The methods (for forming the chip package structure) form a ring-like structure over an interconnect layer to surround conductive bumps so as to separate the conductive bumps from a bump-less region of the interconnect layer adjacent to predetermined scribe lines. Since the bump-less region may affect the coplanarity of the conductive bumps, the ring-like structure separating the conductive bumps from the bump-less region improves the coplanarity of the conductive bumps. Therefore, the yield of a bonding process for bonding the conductive bumps to a substrate is improved.

In accordance with some embodiments, a chip package structure is provided. The chip package structure includes a substrate. The chip package structure includes a chip over the substrate. The chip package structure includes a first conductive bump between the chip and the substrate and connected to the chip. The chip package structure includes a first ring-like structure between the chip and the substrate and connected to the chip. The first ring-like structure surrounds the first conductive bump, the first ring-like structure and the first conductive bump are made of a same first material, the chip includes an interconnect structure, and the first ring-like structure is electrically insulated from the interconnect structure and the first conductive bump.

In accordance with some embodiments, a chip package structure is provided. The chip package structure includes a substrate. The chip package structure includes a chip over the substrate. The chip package structure includes a first conductive bump between the chip and the substrate and connected to the chip. The chip package structure includes a first ring-like structure surrounding the first conductive bump. The first ring-like structure and the first conductive bump are made of a same first material, the first ring-like structure is electrically insulated from the first conductive bump, and the first ring-like structure has a first line width greater than a first width of the first conductive bump.

In accordance with some embodiments, a chip package structure is provided. The chip package structure includes a first substrate having a top surface and a bottom surface. The chip package structure includes a chip over the top surface of the first substrate. The chip package structure includes a first conductive bump over the bottom surface of the first substrate. The chip package structure includes a ring-like structure over the bottom surface of the first substrate. The ring-like structure surrounds the first conductive bump, the ring-like structure and the first conductive bump are made of a same material, and the ring-like structure is electrically insulated from the first conductive bump and the chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a substrate;
a chip over the substrate;
a first conductive bump between the chip and the substrate and connected to the chip; and
a first ring-like structure between the chip and the substrate and connected to the chip, wherein the first ring-like structure surrounds the first conductive bump, the first ring-like structure and the first conductive bump are made of a same first material, the chip comprises an interconnect structure, and the first ring-like structure is electrically insulated from the interconnect structure and the first conductive bump.

2. The chip package structure as claimed in claim 1, wherein the first ring-like structure is a continuous ring structure.

3. The chip package structure as claimed in claim 1, wherein the first ring-like structure has a plurality of portions spaced apart from each other.

4. The chip package structure as claimed in claim 1, further comprising:
a second conductive bump between the first conductive bump and the substrate; and
a second ring-like structure over the substrate, wherein the second ring-like structure surrounds the second conductive bump, and the second ring-like structure and the second conductive bump are made of a same second material.

5. The chip package structure as claimed in claim 4, wherein the second ring-like structure is electrically insulated from the chip.

6. The chip package structure as claimed in claim 5, wherein the second ring-like structure is electrically insulated from the second conductive bump.

7. The chip package structure as claimed in claim 4, wherein the second ring-like structure is not overlapped by the first ring-like structure.

8. The chip package structure as claimed in claim 4, further comprising:
a third conductive bump over a surface of the substrate, wherein the surface faces away from the chip; and
a third ring-like structure over the surface, wherein the third ring-like structure surrounds the third conductive bump, the third ring-like structure and the third conductive bump are made of a same third material, and the third ring-like structure is electrically insulated from the chip and the third conductive bump.

9. The chip package structure as claimed in claim 1, further comprising:
an underfill layer between the chip and the substrate, wherein a portion of the underfill layer is between the first ring-like structure and the substrate.

10. The chip package structure as claimed in claim 1, wherein the first ring-like structure is thinner than the first conductive bump.

11. A chip package structure, comprising:
a substrate;
a chip over the substrate;
a first conductive bump between the chip and the substrate and connected to the chip; and
a first ring-like structure surrounding the first conductive bump, wherein the first ring-like structure and the first conductive bump are made of a same first material, the first ring-like structure is electrically insulated from the first conductive bump, and the first ring-like structure has a first line width greater than a first width of the first conductive bump.

12. The chip package structure as claimed in claim 11, further comprising:
a second conductive bump between the first conductive bump and the substrate; and
a second ring-like structure over the substrate, wherein the second ring-like structure surrounds the second conductive bump, and the second ring-like structure and the second conductive bump are made of a same second material.

13. The chip package structure as claimed in claim 12, wherein the second ring-like structure has a second line width greater than a second width of the second conductive bump.

14. The chip package structure as claimed in claim 12, wherein the first ring-like structure overlaps the second ring-like structure.

15. The chip package structure as claimed in claim 11, wherein a first bottom surface of the first conductive bump is closer to the substrate than a second bottom surface of the first ring-like structure.

16. A chip package structure, comprising:
a first substrate having a top surface and a bottom surface;
a chip over the top surface of the first substrate;
a first conductive bump over the bottom surface of the first substrate; and
a ring-like structure over the bottom surface of the first substrate, wherein the ring-like structure surrounds the first conductive bump, the ring-like structure and the first conductive bump are made of a same material, and the ring-like structure is electrically insulated from the first conductive bump and the chip.

17. The chip package structure as claimed in claim 16, further comprising:
a first solder layer over the first conductive bump; and
a second solder layer over the ring-like structure, wherein the second solder layer is thinner than the first solder layer.

18. The chip package structure as claimed in claim 16, further comprising:
a second conductive bump over the bottom surface of the first substrate, wherein the ring-like structure further surrounds the second conductive bump,
the ring-like structure has a plurality of portions spaced apart from each other by a substantially same first distance, the first conductive bump is spaced apart from the second conductive bump by a second distance, and the substantially same first distance is less than the second distance.

19. The chip package structure as claimed in claim 18, wherein the portions has a strip shape.

20. The chip package structure as claimed in claim 16, further comprising:
- a second substrate, wherein the first substrate is bonded to the second substrate through the first conductive bump; and
- an underfill layer between the first substrate and the second substrate, wherein a portion of the underfill is between the ring-like structure and the second substrate.

* * * * *